United States Patent
Amano et al.

(10) Patent No.: US 6,838,699 B2
(45) Date of Patent: Jan. 4, 2005

(54) ELECTRO-OPTICAL DEVICE WITH UNDERCUT-REDUCING THIN FILM PATTERN AND RETICLE

(75) Inventors: Takahiro Amano, Suwa (JP); Kiyofumi Kitawada, Chino (JP)

(73) Assignee: Seiko Epson Corporation, Tokyo (JP)

(*) Notice: Subject to any disclaimer, the term of this patent is extended or adjusted under 35 U.S.C. 154(b) by 0 days.

(21) Appl. No.: 10/356,518

(22) Filed: Feb. 3, 2003

(65) Prior Publication Data

US 2003/0160244 A1 Aug. 28, 2003

(30) Foreign Application Priority Data

Feb. 12, 2002  (JP) ......................................... 2002-034707
Nov. 27, 2002  (JP) ......................................... 2002-343963

(51) Int. Cl.[7] ............................................. H01L 31/036
(52) U.S. Cl. ............................. 257/72; 257/59; 257/66; 438/149; 438/151; 438/166
(58) Field of Search ............................. 257/59, 66, 72, 257/E31.041, E21.372; 438/149, 151, 157, 166

(56) References Cited

U.S. PATENT DOCUMENTS 5,491,347 A * 2/1996 Allen et al. .................... 257/59
5,844,255 A * 12/1998 Suzuki et al. .................. 257/59
6,642,086 B2 * 11/2003 Lim et al. ..................... 438/149

FOREIGN PATENT DOCUMENTS

| CN | 1125899 A | 7/1996 |
| EP | 0 698 923 A1 | 2/1996 |
| JP | A-2-275638 | 11/1990 |
| JP | A-6-258667 | 9/1994 |

* cited by examiner

*Primary Examiner*—Nathan J. Flynn
*Assistant Examiner*—Scott R Wilson
(74) *Attorney, Agent, or Firm*—Oliff & Berridge, PLC

(57) ABSTRACT

The invention provides a thin-film semiconductor device, which reduces or prevents an undercut from being produced below a thin film when a pattern including an intersection is formed in the thin film. The invention also provides a method of manufacturing the same. A semiconductor film has a pattern including a bent shape or a projected shape. One line segment and another line segment, which define an intersection of the bent shape or the projected shape and which are consecutive, have an additional line segment interposed between ends of the one line segment and the other line segment form a smooth intersection in which each of the angles formed between the additional line segment and the one line segment and between the additional line segment and the other line segment is greater than 90° and less than 180°.

15 Claims, 15 Drawing Sheets

FIG. 5
STEP (D)
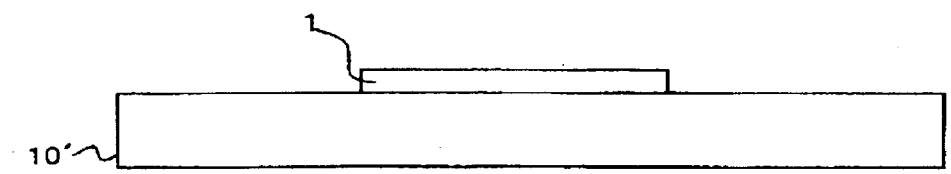
STEP (E)
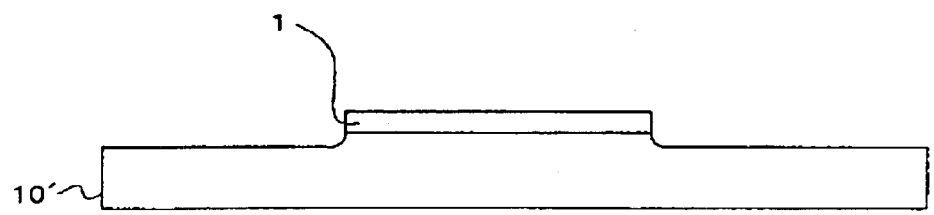
STEP (F)
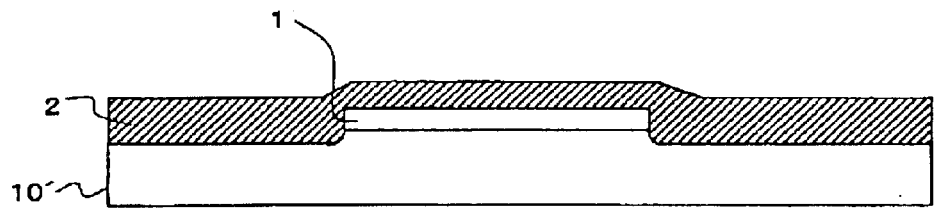
STEP (G)
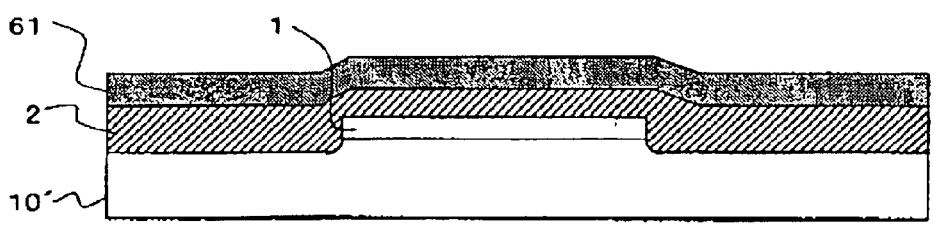

FIG. 6
STEP (D')
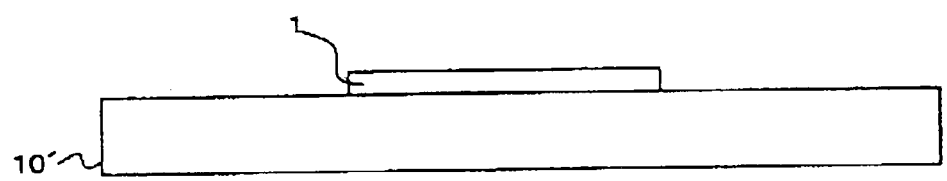
STEP (E')
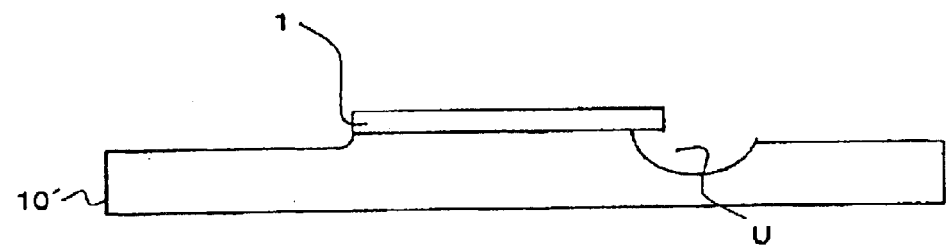
STEP (F')
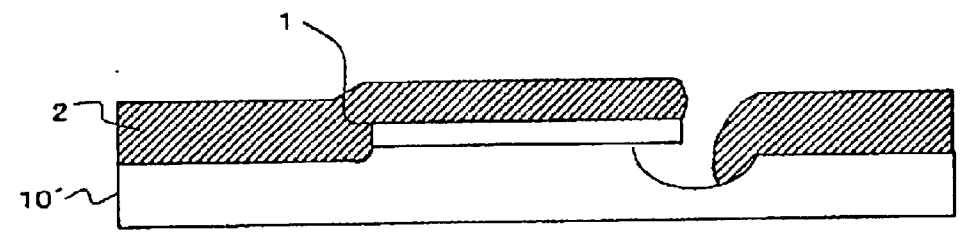
STEP (G')
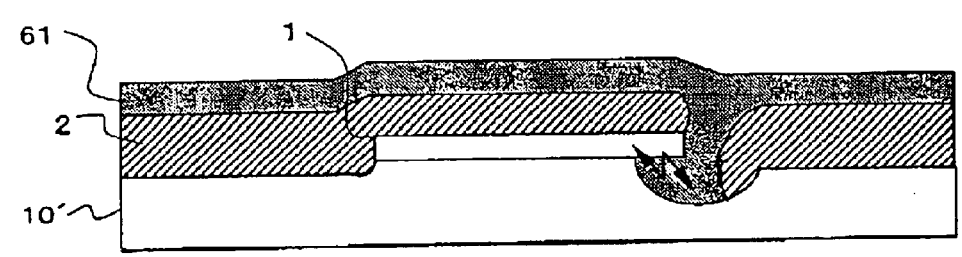

ELECTRO-OPTICAL DEVICE WITH UNDERCUT-REDUCING THIN FILM PATTERN AND RETICLE

BACKGROUND OF THE INVENTION

1. Field of Invention

The present invention relates to thin-film semiconductor devices and methods of manufacturing the same. More specifically, the invention relates to a thin-film semiconductor device, including a thin film which has been formed into a predetermined pattern, and a method of manufacturing the same. Also, the present invention relates to an electro-optical device including such a thin-film semiconductor device, and to a method of manufacturing the same. In addition, the present invention relates to a reticle suitable for use in manufacturing the thin-film semiconductor device and the electro-optical device.

2. Description of Related Art

In the related art, photolithography can be used to form thin-film semiconductor devices. Photolithography is a technique of forming wiring lines, circuit elements, or the like, having a desired pattern, on the surface of a substrate. More particularly, firstly, a thin film composed of, for example, silicon, and subsequently a resist film are formed on the entire surface of the substrate (a film forming step), and then exposure with a predetermined pattern is performed on the resist film (an exposing step). In the related art, the exposure with a predetermined pattern is achieved by a method in which light emitted from a light source is projected onto the resist film via a reticle having the predetermined pattern. With this exposure, the resist film has photosensitive regions and photo-insensitive regions formed therein in accordance with the predetermined pattern.

Then, the resist film is developed and the resist film in the photosensitive region is removed (a developing step). Subsequently, after baking the remaining resist film, by etching a part of the thin film from which the resist film has been removed and which is exposed (an etching step), the thin film is provided with the predetermined pattern, that is, the thin film is formed so as to have predetermined wiring lines and circuit elements (hereinafter the thin film formed as described above is referred to as a "patterned film").

When a thin film, such as an insulating film, is further laminated on the patterned film having the predetermined pattern, sometimes a cleaning step, such as a light etching process using a diluted hydrofluoric acid solution, is conducted in order to clean the surface of the patterned film.

Since wiring lines and circuit elements having various fine patterns can be easily and reliably formed with such a photolithographic technology, in the related art it can be viewed as an essential manufacturing technology in the semiconductor industry. A technique that uses such a photolithographic technology to form liquid crystal devices is disclosed in, for example, Japanese Unexamined Patent Application Publication No. 6-258667 (hereinafter "JP 6-258667).

SUMMARY OF THE INVENTION

However, the related art photolithographic technology is subject to the following problems. That is, when the above-described photolithography is performed in the case in which the predetermined pattern includes a pattern having an intersection formed by one line segment and another line segment which intersect with each other, the etching step, the light etching process, or the like, serving as one step of the photolithography, may produce an undercut at the intersection. This undercut is significant particularly when the intersection has a right angle or the like.

Here, the occurrence of an undercut means that the intersection of the patterned film is deeply etched down to an underlying material below the patterned film. In other words, when the etching process is completed, the surface of the material under the patterned film at the intersection lies in a so-called uncovered state, that is, it is exposed externally.

This state alone is a problem from the viewpoint of stability of a thin-film semiconductor device. In addition, in this case, for example, when it is assumed that the patterned film is composed of a conductive material and a certain film composed of a conductive material is further formed on the patterned film with an insulating film placed therebetween, since the insulating film cannot completely cover a step formed in the region where the undercut is produced, an uncovered part of the patterned film is formed. It is believed that this causes a short circuit between the patterned film and the film composed of a conductive material. In other words, it is believed that a part of the film composed of a conductive material passes around below the patterned film at the intersection, and the uncovered part of the patterned film comes into contact with the film composed of a conductive material. In this state, for example, even when it is intended to activate only the patterned film, the film composed of a conductive material is also activated at the same time, and therefore an accurate operation of the thin-film semiconductor device cannot be expected.

When it is assumed that a thin film transistor array substrate (hereinafter a thin film transistor is abbreviated as "TFT"), or the like, including TFTs, which are major components of an electro-optical device such as a liquid crystal device, corresponds to the foregoing thin-film semiconductor device, the above-described problems can be recognized more specifically. For example, when a semiconductor film including a channel region, and the like, and forming a TFT is assumed as the patterned film, since a gate-insulating film and a gate electrode are formed on the semiconductor film in that order, the foregoing undercut may cause a short circuit between the semiconductor film and the gate electrode.

Also, when one electrode forming a storage capacitor connected to the TFT is assumed as the patterned film, since a dielectric film and another electrode are formed on the one electrode in that order, a short circuit may occur between the one electrode and the other electrode. In particular, in this example, the thickness of the dielectric film is generally made as small as possible in order to increase the storage capacitance, thereby leading to an increased risk of short circuiting.

Although JP-258667 discloses that a short circuit between electrodes of a thin film transistor forming a liquid crystal device can be prevented by setting pattern angles to be "equal to or less than 240°", it does not refer to the above-described undercut.

The present invention addresses or solves the above and/or other problems. Accordingly, the present invention provides a thin-film semiconductor device in which, even when an intersection is formed on the pattern of a thin film, an undercut does not occur below the thin film. The invention also provides a method of manufacturing the same. Also, the present invention provides an electro-optical device including such a thin-film semiconductor device, and provides a method of manufacturing the same. In addition, the present invention provides a reticle suitable for use in manufacturing the thin-film semiconductor device and the electro-optical device.

In order to address or solve the above, a first thin-film semiconductor device according to the present invention includes a thin film which includes a pattern including at least two outer corners and which includes a conductive material. The at least two outer corners include a first outer corner having an interior angle greater than 180° and less than 270°, and a second outer corner lying next to the first outer corner and having an interior angle greater than 90° and less than 180°.

In the first thin-film semiconductor device according to the present invention, the pattern including at least two outer corners includes the first and second outer corners lying next to each other. The former has an interior angle greater than 180° and less than 270° and the latter has an interior angle greater than 90° and less than 180°. Accordingly, two line segments forming the first outer corner are, so to speak, smoothly connected and two line segments forming the second outer corner are, so to speak, smoothly connected as well. When the first and second outer corners lie next to each other, one of the two line segments forming the first outer corner is in common with one of the two line segments forming the second outer corner.

With this arrangement, since no intersection including a right angle as that described relative to the related art exists between any two of the foregoing line segments, the risk of occurrence of an undercut below a patterned film can be drastically reduced. In addition, since the patterned film composed of a conductive material can be formed without the risk of producing such an undercut, in accordance with the present invention, even when another film composed of a conductive material is formed on the patterned film with an insulating film interposed therebetween, the risk of short circuiting or the like between the patterned film and the thin film composed of a conductive material and formed on the pattern film can be reduced, thereby enhancing reliability of the thin-film semiconductor device.

In order to address or solve the above, a second thin-film semiconductor device according to the present invention includes a thin film which includes a pattern including at least two outer corners and which includes a conductive material. The at least two outer corners include third and fourth outer corners lying next to each other, each outer corner having an interior angle greater than 180° and less than 270°.

In the second thin-film semiconductor device according to the present invention, the pattern including at least two outer corners includes the third and fourth outer corners lying next to each other. Each of the third and fourth corners both has an interior angle greater than 180° and less than 270°. Accordingly, two line segments forming the third outer corner are, so to speak, smoothly connected and two line segments forming the fourth outer corner are, so to speak, smoothly connected as well. When the third and fourth outer corners lie next to each other, one of the two line segments forming the third outer corner is in common with one of the two line segments forming the fourth outer corner.

With this arrangement, since no intersection in which a right angle is formed as described relative to the related art lies between any two of the foregoing line segments, the risk of occurrence of an undercut below a patterned film can be drastically reduced. In addition, since the patterned film composed of a conductive material can be formed without the risk of producing such an undercut, in accordance with the present invention, even when another film composed of a conductive material is formed on the patterned film with an insulating film interposed therebetween, the risk of short circuiting or the like between the patterned film and the thin film composed of a conductive material and formed on the pattern film can be reduced, thereby enhancing reliability of the thin-film semiconductor device.

In order to address or solve the above, a third thin-film semiconductor device according to the present invention includes a thin film which includes a pattern including at least two outer corners and which includes a conductive material. The at least two outer corners include a fifth outer corner having an interior angle greater than 180° and less than 270° and a sixth outer corner lying next to the fifth outer corner and having an interior angle equal to or greater than 90°.

In the third thin-film semiconductor device according to the present invention, the pattern including at least two outer corners includes the fifth and sixth outer corners lying next to each other. The former has an interior angle greater than 180° and less than 270° and the latter has an interior angle equal to or greater than 90°. Accordingly, two line segments forming the fifth outer corner are, so to speak, smoothly connected and two line segments forming the sixth outer corner are, so to speak, smoothly connected as well. When the fifth and sixth outer corners lie next to each other, one of the two line segments forming the fifth outer corner is in common with one of the two line segments forming the sixth outer corner.

With this arrangement, since no intersection in which a right angle is formed as described relative to the related art lies between any two of the foregoing line segments, the risk of occurrence of an undercut below a patterned film can be drastically reduced. In addition, since the patterned film composed of a conductive material can be formed without the risk of producing such an undercut, in accordance with the present invention, even when another film composed of a conductive material is formed on the patterned film with an insulating film interposed therebetween, the risk of short circuiting or the like between the patterned film and the thin film composed of a conductive material and formed on the pattern film can be reduced, thereby enhancing reliability of the thin-film semiconductor device.

In order to solve or address the above, a fourth thin-film semiconductor device according to the present invention includes a thin film which includes a pattern including a bent shape or a projected shape and which includes a conductive material. At least one set formed of one line segment and another line segment, which define an intersection of the bent shape or the projected shape and which are consecutive, includes an additional line segment between ends of the one line segment and the other line segment and forms a smooth intersection in which each of the angles formed between the additional line segment and the one line segment and between the additional line segment and the other line segment is greater than 90° and less than 180°.

In the fourth thin-film semiconductor device according to the present invention, the thin film has the pattern including the bent shape or the projected shape. A "bent shape" is formed such that, for example, when one rectangular pattern extends vertically in plan view, another rectangular pattern extends, from the upper edge of the one rectangular pattern, along its longitudinal direction different from the vertical direction. For simplifying the explanation, it is assumed that the above-mentioned "longitudinal direction different from the vertical direction" lies simply towards the right (or the left) and that the longitudinal direction of the one rectangular pattern is orthogonal to that of the other rectangular pattern.

Then, when the one rectangular pattern and the other rectangular pattern are combined, the combined pattern shows a so-called "hook" shape. This is a typical example of a "bent shape".

Also, a "projected shape" is formed such that, for example, when one rectangular pattern extends horizontally in plan view, another rectangular pattern extends, from the central part of the longitudinal length of the one rectangular pattern, along its longitudinal direction different from the horizontal direction. For also simplifying the explanation, it is assumed that the above-mentioned "direction different from the horizontal direction" lies simply upwards (or downward) and that these rectangular patterns are orthogonal to each other.

Then, when the one rectangular pattern and the other rectangular pattern are combined, the combined pattern shows a so-called "protruded" shape. This is a typical example of a "projected shape".

In the present invention, in particular, at least one set formed of one line segment and another line segment, which define the intersection of the bent shape or the projected shape and which are consecutive, is assumed here.

For example, in the "hook" shape mentioned as a typical example of the foregoing bent shape, it is considered that the "one line segment" corresponds to a part of the right side of the one rectangular pattern extending vertically and the "other line segment" corresponds to a part of the under side of the other rectangular pattern extending towards the right (or the left).

In addition, in the present invention, the at least one set formed of the one line segment and the other line segment further includes the additional line segment between ends of the one line segment and the other line segment and forms a smooth intersection in which each of the angles formed between the additional line segment and the one line segment and between the additional line segment and the other line segment is greater than 90° and less than 180°.

That is, in accordance with the present invention, the "additional line segment" lies between an end of the one line segment, i.e., the part of the foregoing right side, and an end of the other line segment, i.e., the part of the foregoing lower side, and a "smooth intersection", in which an angle between the additional line segment and the foregoing right side is greater than 90° and less than 180° and an angle between the additional line segment and the foregoing lower side is also greater than 90° and less than 180°, is formed.

In other words, in the above-described example, with the "additional line segment" lying between the foregoing right side and lower side, these two sides are, so to speak, "smoothly" connected, while they would be orthogonal to each other without the "additional line segment".

This structure provides or enables the following advantage to be provided. That is, a right-angled portion formed by the just above-mentioned "right and lower sides which would be orthogonal to each other" would have a risk of producing an undercut below the patterned film at the right-angled portion as described relative to the related art. However, in accordance with the present invention, the additional line segment is inserted between the one line segment and the other line segment so as to, so to speak, "smoothly" connect the one line segment and the other line segment as described above, thereby leading to a lower risk of producing the undercut.

In addition, although the patterned film formed in the above-described manner is composed of a conductive material in the present invention, even when another film composed of a conductive material is formed on the patterned film with an insulating film interposed therebetween, the risk of short circuiting between the patterned film and the thin film composed of a conductive material and formed on the patterned film can be reduced in accordance with the present invention, thereby enhancing reliability of the thin-film semiconductor device.

Although the "smooth intersection" of the hook-shape pattern formed by the foregoing right and lower sides has been described, those skilled in the art will appreciate that other various "smooth intersections" can be included in the present invention. For example, it is apparent to those skilled in the art that, in a pattern having a "protruded" shape, the upper and left sides of one rectangular pattern extending horizontally are also orthogonal to each other although having an inversed relationship with the above-described intersection. According to the present invention, an additional line segment may be inserted between the foregoing upper and left sides so as to form a "smooth intersection" if necessary.

In association with the foregoing "inverse relationship" and "smooth intersection", the "angle" in association with the present invention is explained in more detail below.

When one line segment and another line segment intersect with each other, in general, two mutually supplementary angles $\alpha°$ and $(360-\alpha)°$ are defined by the two line segments. Basically, the "angle" in association with the present invention may be any one of them and is satisfactory as long as the one angle is "greater than 90° and less than 180°". In this case, the other angle (supplementary angle) is always "greater than 180° and less than 270°".

Next, taking the above-described circumstances into account, it should be noted that the "smooth intersection" described by using the one set formed of the "upper and lower sides" of the hook-shape pattern as an example is different from the just above "smooth intersection" by using the one set formed of the "upper and left sides" of the projected pattern as an example. That is, the "angle" related the former is an "angle" of an "outer corner" formed outside the pattern when viewed from the former smooth intersection; whereas, the "angle" related to the latter is an "angle" of an "inner corner" formed inside the pattern when viewed from the latter smooth intersection. Although the one line segment and the other line segment are "smoothly" connected in any case and the present invention includes all these configurations, it should be interpreted that the "angle" in association with the present invention means only one of the two angles, depending on either the foregoing "outer corner" or "inner corner".

The terms "outer corner" and "inner corner" are used so as to have the above-described meanings in the specification. Also, the term "interior angle" is sometimes used so as to mean an "angle of the "inner corner"" in the present invention.

On the other hand, the patterns having typical "hook-shape" and "protruded shape" have been just mentioned by way of example. That is, other than these patterns, the present invention is also applicable to an example pattern having a "projected shape", in association with the present invention, in which one rectangular pattern extends horizontally and another rectangular pattern, extending along a direction lying at an example angle of 45°, not lying at a right angle, with the horizontal direction, is connected to the one rectangular pattern. Those skilled in the art will appreciate that the present invention includes patterns having a variety of shapes.

In addition, as patterns having the above-mentioned typical "bent shapes" and "projected shapes" are rarely used without a modification in actual thin film semiconductor devices installed in a variety of electronic apparatuses, modified patterns are not excluded in the scope of the present invention. For example, even in a wiring line including a certain pattern having a complicated shape, since it can be considered that the wiring line includes the above-mentioned "bent shape" and "projected shape" as its basic element, when at least one set formed of one line segment and another line segment forming such a "bent shape" and "projected shape" forms a "smooth intersection" in association with the present invention, such a pattern is of course included with the scope of the present invention.

In one variation of any one of the first to fourth thin-film semiconductor devices, an insulating film having a thickness in the range from 10 to 150 nm (nanometers) is formed on the thin film and another thin film including a conductive material is formed on the insulating film.

With this variation, an advantage of the present invention can be more effectively obtained. That is, in this variation, the other thin film composed of a conductive material is formed on the thin film with the insulating film interposed therebetween, the insulating film having a relatively small thickness in the range from 10 to 150 nm. As a result, the risk of short circuiting between the thin film and the other thin film would be high if the above-mentioned undercut is produced; however, in this variation, since the "smooth intersection" is formed, the risk of occurrence of the undercut is reduced, thereby reducing the risk of the short circuiting.

Accordingly, with this variation, an accurate operation of the thin film semiconductor device can be achieved.

In another variation of the fourth thin-film semiconductor device, each of the angles formed between the additional line segment and the one line segment and between the additional line segment and the other line segment is about 135°.

With this variation, the "additional line segment" is assumed to lie between the one line segment and the other line segment, which would be, for example, orthogonal to each other without the additional line segment, so as to obliquely bridge ends of these two line segments. This is one of the variations in which a "smooth" connection between the one line segment and the other line segment is most effectively achieved without making the pattern complicated.

In another variation of the fourth thin-film semiconductor device, an insulating film having a thickness equal to or less than 50 nm is formed on the thin film and another thin film comprising a conductive material is formed on the insulating film, and each of the angles formed between the additional line segment and the one line segment and between the additional line segment and the other line segment is greater than 135°.

With this variation, since the other thin film composed of a conductive material is formed on the thin film with the insulating film having a very small thickness equal to or less than 50 nm interposed therebetween, the risk of short circuiting, between the thin film and the other thin film, due to the above-mentioned undercut is high.

However, in this variation, since each "angle" is greater than 135°, the one line segment and the other line segment are more "smoothly" connected, whereby the foregoing undercut is more unlikely to occur. Accordingly, with this variation, even when a very thin insulating film is formed, the risk of short circuiting between the "thin film" and the "other thin film" can be reduced drastically.

In another variation of the fourth thin-film semiconductor device, the one set includes a plurality of the additional line segments and forms a smooth intersection in which each angle formed between the consecutive additional line segments is greater than 90° and less than 180°.

With this variation, since the plurality of additional line segments exist and the smooth intersection in which each of the angles formed between the consecutive additional line segments is greater than 90° and less than 180° is formed, the one line segment and the other line segment can be more smoothly connected than those described above.

For example, when two mutually orthogonal lines are taken and parts of these two lines are respectively defined as "one line segment" and "another line segment", it can be assumed that each of the angles between the one line segment and a first additional line segment, between the first additional line segment and a second additional line segment, and between the second additional line segment and the other line segment is 150°.

In another variation of the fourth thin-film semiconductor device, an arc having a predetermined curvature lies between the ends of the one line segment and the other line segment, in place of the additional line segment or in addition thereto.

With this variation, the one line segment and the other line segment are more smoothly connected to each other than those described above are. In particular, when a circular arc having a size equal to or smaller than a quarter circle is used as a curved line, more particularly, as an arc, in place of the additional line segment, the one line segment and the other line segment, which are typically orthogonal to each other, can be more smoothly connected than those connected by at least one additional straight line segment.

In a configuration including a very large number of the foregoing additional line segments, it does not make sense to consider an "angle" formed between the two neighboring additional line segments; instead, it can be assumed that the one line segment and the other line segment are connected by "an arc having a predetermined curvature" as described in this variation. The present invention includes such a variation.

In another variation of the fourth thin-film semiconductor device, each of the angles is an angle of the corresponding outer corner formed outside the pattern when viewed from the smooth intersection.

With this variation, an "angle" in association with the present invention is defined as the above-mentioned angle or the angle of the foregoing "outer corner". In this case, since the angle of the above-mentioned outer corner is "greater than 90° and less than 180°", it is implicitly presumed that the angle of the inner corner formed between the one line segment and the other line segment is greater than 180° and less than 360° when an additional line segment is not inserted. Such an "inner corner" likely causes the above-mentioned undercut to occur, in particular, when the inner corner has an angle equal to or greater than 270° and less than 360°.

On the other hands, with this variation, since the above-mentioned angle is an angle of the corresponding outer corner formed outside the pattern when viewed from the smooth intersection, such an undercut rarely occurs, and accordingly the risk of short circuiting between the "thin film" and the "other thin film" can be more effectively reduced.

In order to address or solve the above, an electro-optical device according to the present invention includes pixel electrodes; thin film transistors connected to the pixel electrodes; wiring lines connected to the thin film transistors; and storage capacitors connected to the thin film transistors. At least one electrode forming the storage capacitor comprises a thin film which includes a pattern including a bent shape or a projected shape and which includes a conductive material. At least one set formed of one line segment and another line segment, which define an intersection of the bent shape or the projected shape and which are consecutive, includes an additional line segment between the ends of the one line segment and the other line segment and forms a smooth intersection in which each of the angles formed between the additional line segment and the one line segment and between the additional line segment and the other line segment is greater than 90° and less than 180°.

In the electro-optical device according to the present invention, the at least one electrode forming the storage capacitor is formed by the pattern including the above-mentioned "bent shape" or "projected shape", and also said at least one additional line segment satisfying all the above conditions lies between the one line segment and the other line segment which define the bent shape or the projected shape and which are consecutive.

In other words, in accordance with the present invention, in the step of forming said at least one electrode forming the storage capacitor by photolithography or the like, an undercut is not produced below this electrode, and as a result, the risk of short circuiting between this electrode and another thin film composed of a conductive material and formed above the former electrode is reduced, whereby an accurate operation of the electro-optical device according to the present invention can be achieved.

In one variation of the electro-optical device according to the present invention, an insulating film having a thickness of 10 to 150 nm is formed on the thin film, and another thin film comprising a conductive material is formed on the insulating film. Also, in another variation of the same, each of the angles formed between the additional line segment and the one line segment and between the additional line segment and the other line segment is about 135°.

In these variations, the electro-optical device has substantially the same advantage as that of the one and the other variations of the above-described thin film semiconductor device according to the present invention.

In another variation of the electro-optical device according to the present invention, the at least one electrode forming the storage capacitor is formed from the same semiconductor film as that of the thin film transistors.

With this variation, said at least one electrode forming the storage capacitor and the semiconductor film forming the thin film transistors are formed from the common film at the same time, whereby the manufacturing cost can be further reduced, compared to the case in which they are independently formed.

In order to address or solve the above, a method of manufacturing a thin-film semiconductor device according to the present invention is a method of manufacturing a thin film semiconductor with a thin film which includes a pattern including a bent shape or a projected shape and which includes a conductive material. The method includes: forming an initial film, used for the thin film, on a substrate; forming a resist film on the initial film; exposing the resist film using a reticle including the pattern, or a negative shape of the pattern, formed therein; developing the resist film; and etching the developed resist film and the initial film. The pattern includes at least one set formed of one line segment and another line segment, which define an intersection of the bent shape or the projected shape and which are consecutive, includes an additional line segment between the ends of the one line segment and the other line segment, and includes a smooth intersection in which each of the angles formed between the additional line segment and the one line segment and between the additional line segment and the other line segment is greater than 90° and less than 180°. The initial film is formed so as to have the pattern in the etching step.

With the method for manufacturing a thin film semiconductor device according to the present invention, the above-described thin film semiconductor device according to the present invention can be manufactured in a suitable manner.

In one variation of the method of manufacturing a thin-film semiconductor device according to the present invention, the method further includes wet-etching the substrate and the patterned film obtained in the step of etching the initial film.

With this variation, since the step of wet-etching the substrate and the patterned film is further included, the risk of occurrence of the foregoing undercut increases further because the wet-etching process generally accelerates isotropic corrosion. However, in accordance with the present invention, since the foregoing initial thin film is formed so as to have a pattern including the "smooth intersection", the risk of short circuiting remains low.

The "wet-etching" process in this variation includes, for example, the above-mentioned light etching process, that is, an etching process of cleaning the surface of the patterned film, for example, using a diluted hydrofluoric acid solution.

A method of manufacturing an electro-optical device according to the present invention is a method of manufacturing an electro-optical device including pixel electrodes; thin film transistors connected to the pixel electrodes; wiring lines connected to the thin film transistors; and storage capacitors connected to the thin film transistors. The method includes: forming at least one electrode forming each of the storage capacitors in accordance with the method of manufacturing a thin-film semiconductor device or one variation of the same according to the present invention.

With the method for manufacturing an electro-optical device according to the present invention, the above-described electro-optical device according to the present invention can be formed in a suitable manner.

In order to address or solve the above, a reticle according to the present invention includes a pattern, or a negative shape of the pattern, formed therein. The pattern includes at least one set of one line segment and another line segment, which define an intersection of the bent shape or the projected shape and which are consecutive, includes an additional line segment between the ends of the one line segment and the other line segment, and includes a smooth intersection in which each of the angles formed between the additional line segment and the one line segment and between the additional line segment and the other line segment is greater than 90° and less than 180°.

With the reticle according to the present invention, the above-described method of manufacturing a thin film semiconductor device or an electro-optical device can be performed in a suitable manner.

Such an operation and other advantages of the present invention will become apparent from exemplary embodiments described below.

BRIEF DESCRIPTION OF THE DRAWINGS

FIGS. 5(D)–5(G) are sectional views of the second sequential process of forming the pattern of the semiconductor film and the storage capacitor shown in FIGS. 1 and 2, following the first process of forming the same;

FIGS. 6(D'–G') are sectional views of a sequential process of forming the pattern of the semiconductor film and a storage capacitor shown in FIG. 3, where Steps (D) to (G) in FIG. 5 are replaced by Steps (D') to (G'), respectively;

DETAILED DESCRIPTION OF PREFERRED EMBODIMENTS

Exemplary embodiments of the present invention are further described with reference to the accompanying drawings.

First Exemplary Embodiment

Firstly, for better understanding of the spirit of the present invention, descriptions for a first exemplary embodiment will focus on patterning which is performed in a process in which TFTs and storage capacitors are formed on a glass substrate which will become a TFT array substrate forming an electro-optical device such as a liquid-crystal display device. The electro-optical device, the TFT array substrate and the like serving as components of the device, positions of the TFTs, the storage capacitors, and components forming the TFTs and the storage capacitors in the electro-optical device, etc., are described further below.

Figure 1:
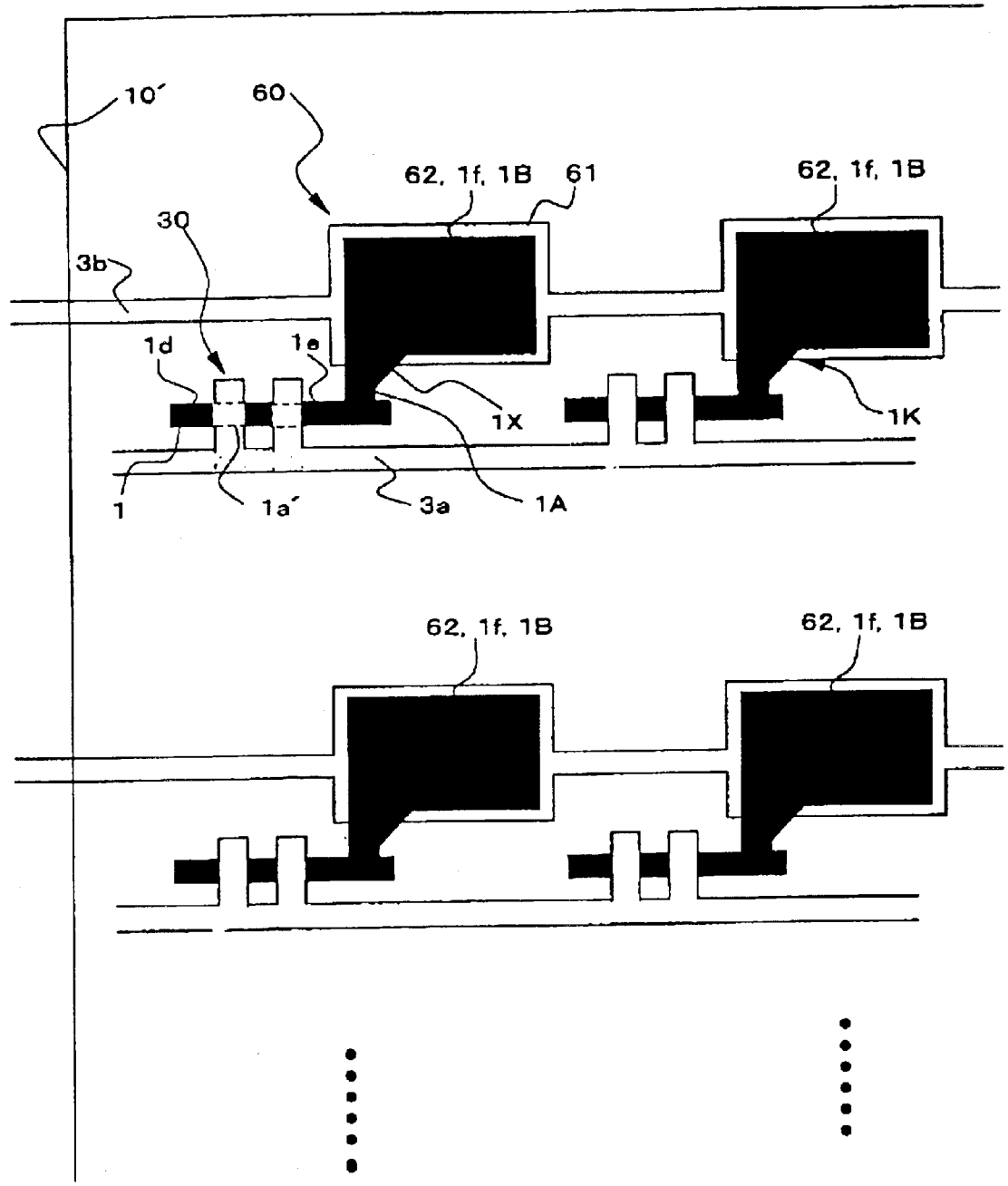
FIG. 1 is a plan view showing patterns of a semiconductor film, each having a smooth intersection to prove a smooth connection, according to a first exemplary embodiment of the present invention.

TFTs 30 and storage capacitors 60 shown in FIG. 1 are eventually formed on a glass substrate 10' in the first exemplary embodiment. In FIG. 1, the pluralities of the TFTs 30 and the storage capacitors 60 are formed on the glass substrate 10' in a matrix array.

Each TFT 30 includes a semiconductor film 1, having a predetermined pattern represented by a black shaded part in FIG. 1, a gate-insulating film (not shown in FIG. 1) formed on the semiconductor film 1, and gate electrodes formed on the gate-insulating film. The gate electrodes serve as part of a scanning line 3a extending horizontally in FIG. 1. By activating or deactivating the scanning line 3a lying on a given line, the gate electrodes can activate or deactivate all TFTs 30 lying on the same line as the given line at the same time.

The semiconductor film 1 includes channel regions 1a' disposed below the gate electrodes, with the gate-insulating film disposed therebetween, a source region 1d, and a drain region 1e, the latter two being formed adjacent to both sides of the channel regions 1a'. In the first exemplary embodiment, as shown in FIG. 1, the two channel regions 1a' are provided so as to form a so-called dual gate structure. Also, although not shown in FIG. 1, a source electrode and a drain electrode are formed on the source region 1d and the drain region 1e (respectively corresponding to a "highly doped source region 1d'" and a "highly doped drain region 1e'", which are described further below). The source electrode corresponds to a part of a data line 6a in a liquid-crystal display device, which are described further below. In addition, a transparent electrode 8 and a reflective electrode 9 are electrically connected to the drain electrode via a source line 6b and the like, and also oppose a liquid crystal 50.

As shown in FIG. 1, the storage capacitor 60 includes an upper electrode 61, a lower electrode 62, and a dielectric film (not shown in FIG. 1) which is sandwiched between these two electrodes. The upper electrode 61 serves as part of a capacitor line 3b, and is formed from the same film as that of the scanning line 3a; that is, in the manufacturing step, when the scanning line 3a is formed, the upper electrode 61 is also formed at the same time. Also, the lower electrode 62 is formed from the same film as that of the semiconductor film 1 forming the foregoing TFT 30, and also an extension 1f extending from the semiconductor film 1 doubles as the lower electrode 62. In addition, the dielectric film is formed from the same film as that of the gate-insulating film forming the foregoing TFT 30.

Although this is described below, such a storage capacitor 60 is used to maintain an electric field, for a given length of time, applied to the liquid crystal of a corresponding pixel.

Figure 2:
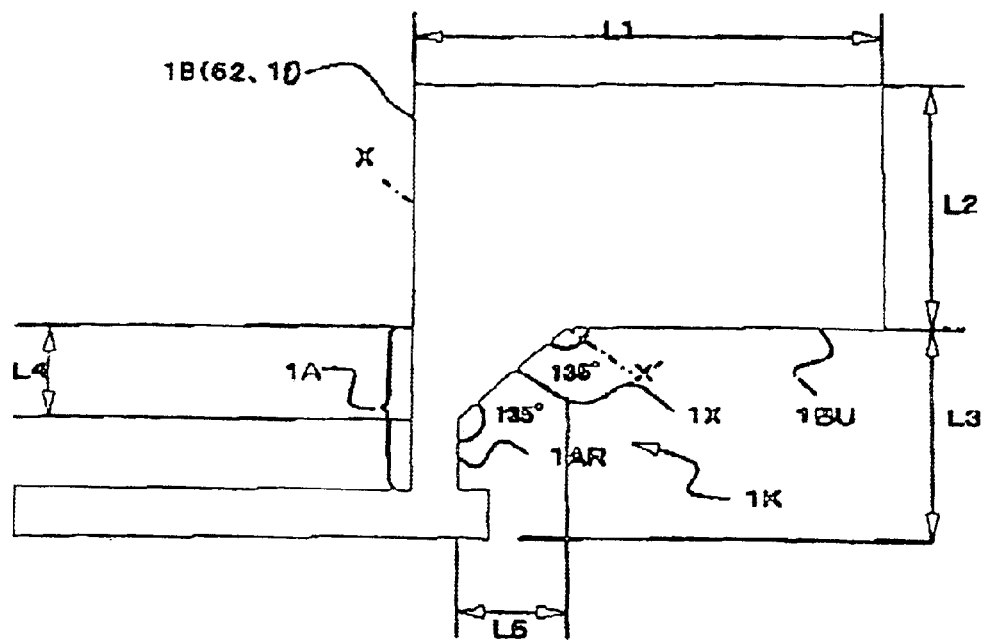
FIG. 2 is a plan view showing only the pattern of the semiconductor film shown in FIG. 1.

The first exemplary embodiment is especially characterized by the pattern of the semiconductor film 1, in particular, by a smooth intersection, denoted by 1K, as part of the storage capacitor 60. FIG. 2 illustrates only the pattern of the semiconductor film 1. In the first exemplary embodiment, the smooth intersection 1K in the semiconductor film 1 is a part of a so-called "hook-shape" shown in FIGS. 1 and 2.

More particularly, the "hook shape" in the first exemplary embodiment is a shape in which one rectangular pattern (hereinafter a "fist pattern") 1A, which extends upwards in FIGS. 1 and 2 from a portion including the channel regions 1a' and so forth serving as parts of the TFT 30, is connected with another rectangular pattern (hereinafter a "second pattern") 1B, which extends upwards from the upper edge of the first pattern 1A and has a longitudinal length towards the right orthogonal to the vertical direction in FIGS. 1 and 2. The "second pattern 1B" defined here substantially agrees with the foregoing lower electrode 62, or extension 1f.

An additional line segment 1X lies between a right side 1AR of the first pattern 1A and a lower side 1BU of the second pattern 1B, and also, angles between the right side 1AR and the additional line segment 1X and between the lower side 1BU and the additional line segment 1X are each set to be 135°. The "angle" having a specific value of 135° is an angle of an "outer corner" formed outside the extension 1f when viewed from the smooth intersection 1K, as shown in FIGS. 1 and 2.

Figure 3:
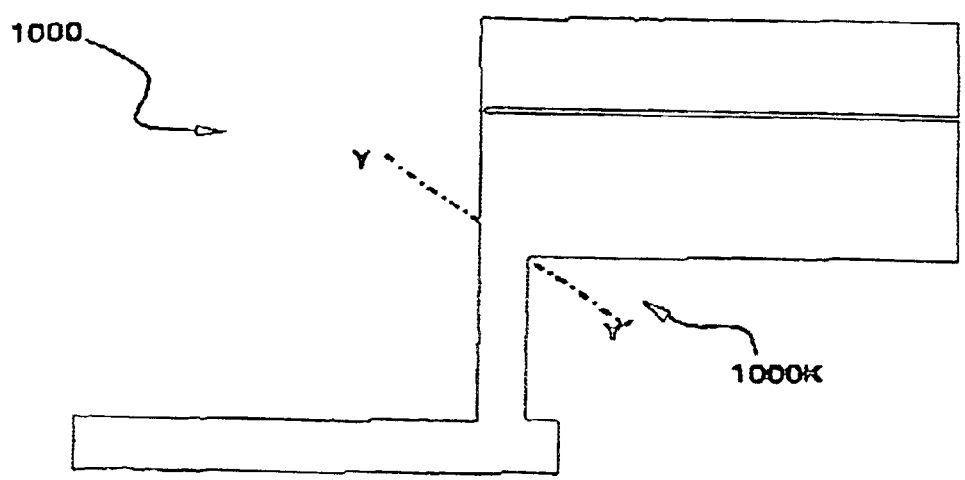
FIG. 3 is a plan view showing only a pattern of a comparative-example semiconductor film.
Figure 4:
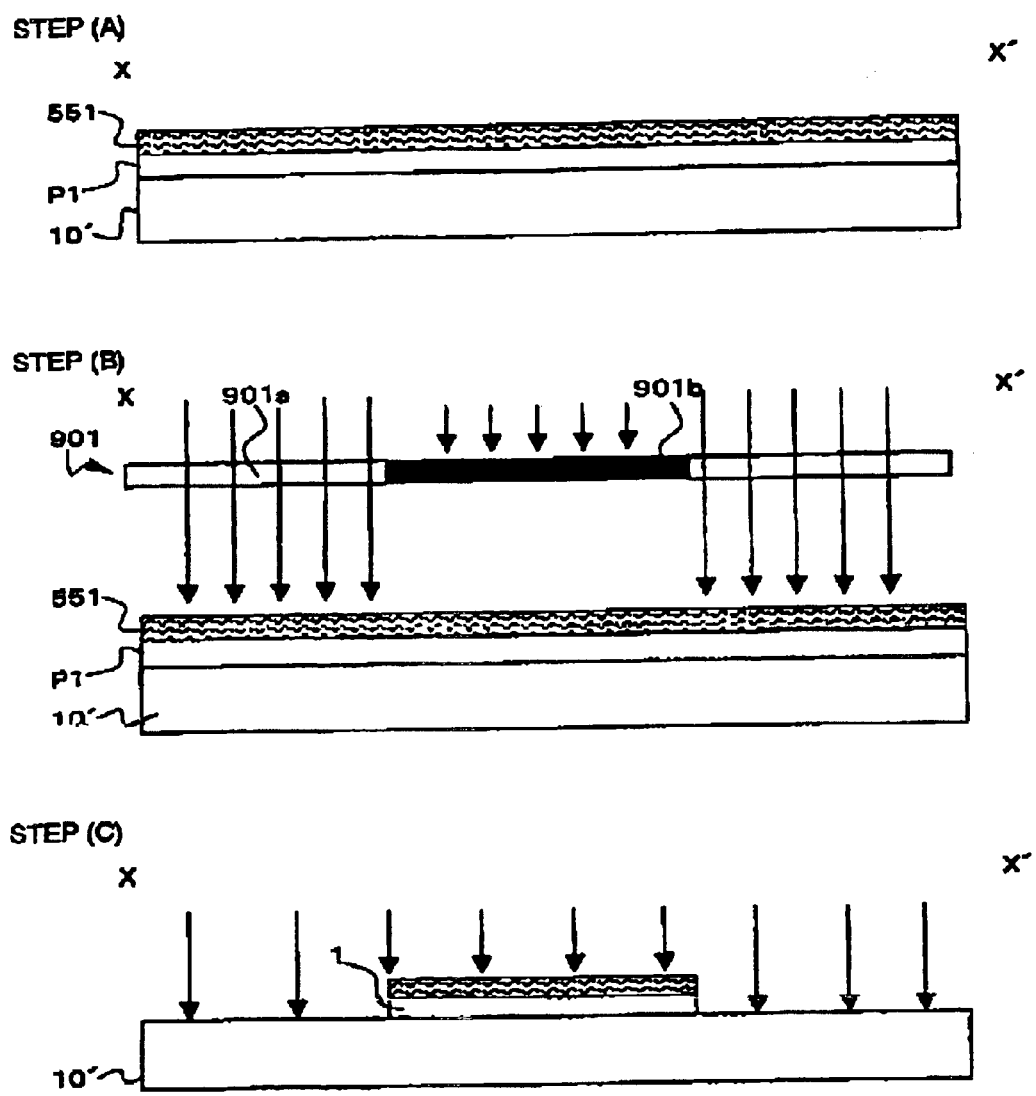
FIGS. 4(A)–4(C) are sectional views of the first sequential process of forming the pattern of the semiconductor film and a storage capacitor shown in FIGS. 1 and 2.

That is, in the first exemplary embodiment, the right side 1AR and the lower side 1BU are, so to speak, "smoothly" connected with each other by the smooth intersection 1K. This is different from the pattern of a related art semiconductor film 1000 in which the foregoing right side 1AR and lower side 1BU form an intersection 1000K having a right angle, as shown in FIG. 3.

In the pattern shown in FIG. 2, each supplementary angle (i.e., an "angle of an inner corner" or an "interior angle") of two 135° angles shown in FIG. 2 is 225°, which is greater than 180° and less than 270°. That is, these outer corners correspond to a "third outer corner" and a "fourth outer corner" in the present invention. In addition, since it can also be considered that one of the supplementary 225° angles is greater than 180° and less than 270°, and the other supplementary 225° angle is equal to or greater than 180°, one of these outer corners can be also considered as a "fifth outer corner" and the other is considered as a "sixth outer corner".

The semiconductor film 1 or the extension 1f forming such a configuration, together with the foregoing dielectric film and upper electrode 61 formed on the extension 1f, offer an advantage, which is specific to the present invention, of reducing the risk of short circuiting between the semiconductor film 1 and the upper electrode 61.

Referring now to FIGS. 4(A) to 6(G'), this advantage is described while explaining the process of forming the foregoing components. FIGS. 4(A)–5(G) illustrate a sequential process of forming the semiconductor film 1, a dielectric film 2, and the upper electrodes 61 in sectional view taken along plane X–X' indicated in FIG. 2, and FIGS. 6(D'–G') illustrate the process in sectional view taken along plane Y–Y' indicated in FIG. 3. In FIGS. 6(D'–G'), Steps (D) to (G) in FIG. 5 are respectively replaced by Steps (D') to (G').

As shown in FIGS. 4(A)–4(C), first, an initial thin film P1 which will be used for the semiconductor film 1 and which is composed of, for example, silicon, is formed on the glass substrate 10' which has been subjected to an appropriate cleaning step, and also, a resist film 551 is formed on the initial film P1 in Step (A). Although not described in detail here, since the initial film P1 is amorphous when it is formed, a step of transforming it so as to have a polycrystalline structure by laser annealing or the like is generally conducted (refer to Step S12 in FIG. 17 and its explanation).

Second, the resist film 551 is irradiated with light emitted from a light source via a reticle 901 (an exposing step) in Step (B). The reticle 901 has transmissive portions 901a formed therein, which are just the inverse pattern of the pattern shown in FIG. 1, corresponding to the entire surface of the glass substrate 10' and non-transmissive portions 901b formed in the remaining part thereof. Those skilled in the art will appreciate that the shape of the foregoing "smooth" intersection 1K is also reflected in the pattern formed by the transmissive portions 901a and the non-transmissive portions 901b. In this step, photosensitive regions and non-photosensitive regions-corresponding to the pattern shown in FIG. 1 are formed on the resist film 551.

Next, in Step (C), the resist film 551 which has been partially exposed as mentioned above is developed to remove the resist film 551 lying in the photosensitive regions (a developing step). Then, by applying a baking process or the like to the remaining resist film 551, and then by etching a part of the initial film P1 from which the resist film 551 has been removed and which is exposed (an etching step), the initial film P1 is provided with a predetermined pattern, that is, the initial film P1 forms the semiconductor film 1.

The following description focuses on a process for forming the storage capacitor 60, and the "semiconductor film 1" will be called the "extension 1f".

Subsequently, as shown in FIGS. 5(D)–5(G), the resist film 551 is peeled off in Step (D). Then, in Step (E), in order to clean the surface of the semiconductor film 1, a light etching process is applied to the glass substrate 10', using a diluted hydrofluoric acid solution, before the insulating film is deposited on the glass substrate 10'. With this process, the surface of the region of the glass substrate 10' on which the semiconductor film 1 is not laminated is lightly etched.

As shown by comparing Step (E) in FIG. 5 and Step (E') in FIG. 6, in the latter step, the etching process reaches below a part of the semiconductor film 1, which corresponds to a right-angled portion shown in FIG. 3, and an undercut U is produced. In other words, in Step (E') in FIG. 6, the surface of the material under the extension 1f lies in a co-called uncovered state and is exposed. On the other hand, the undercut U is not produced in Step (E) in FIG. 5, since the smooth intersection 1K forming the extension 1f is "smooth", as shown in FIG. 2, and is accordingly different from the intersection 1000K shown in FIG. 3.

Next, the dielectric film 2 on the extension 1f is formed in Step (F) in FIG. 5. Then, the upper electrode 61 is formed in Step (G) in FIG. 5 on the dielectric film 2 so as to complete the storage capacitor 60. In an actual step of forming the storage capacitor 60, a step of implanting impurity ions into the lower electrode 62 is conducted (refer to Step 15 in FIG. 17) in order to provide necessary conductivity to the lower electrode 62. Also, at the same time as when the dielectric film 2 is formed, the gate-insulating film is formed on a part of the semiconductor film 1 from which the extension 1f is excluded and which will become the TFT 30. That is, the dielectric film 2 and the gate-insulating film are essentially no different from each other. However, the part of the semiconductor film 1 which will become the TFT 30 is subjected to an implantation of predetermined impurity ions or the like, which will be described later.

When Steps (F) and (G) in FIG. 5 are compared with Steps (F') and (G') in FIG. 6, the difference therebetween becomes apparent. That is, in Step (F') in FIG. 6, the dielectric film 2 is not successfully formed because of the presence of the undercut U shown in Step (E') in FIG. 6. More particularly, the dielectric film 2 is formed only on the extension 1f and the glass substrate 10', but it is not formed in the undercut U, as if avoiding it. This is due to the fact that, when a step of forming a film is conducted by sputtering or the like, a sufficient amount of particles is not supplied to a part of a target which lies behind the target. For example, this is more easily understood when imagining a scene in which snow is falling thickly on the ground. Accordingly, as shown in Step (G') in FIG. 6, when the upper electrode 61 is subsequently formed, a part of the upper electrode 61 enters a region, that is, the undercut U, in which the dielectric film 2 is sufficiently formed. As a result, as shown by an arrow in Step (G') in FIG. 6, the extension 1f and the upper electrode 61 come into contact with each other, thereby leading to a short circuit therebetween.

In the first exemplary embodiment, the above-described problem does not occur, as shown from Step (G) in FIG. 5. That is, the risk of short circuiting between the extension 1f and the upper electrode 61 can be reduced. Such a reduction comes from the advantage that the smooth intersection 1K in the extension 1f is smoothly connected.

The foregoing advantage is more effective when the foregoing dielectric film 2 is formed so as to have a relatively small thickness, for example, on the order of 10 to 150 nm, since the thinner the dielectric film 2, the more likely the occurrence of short circuiting between the extension 1f and the upper electrode 61, as seen from Step (G') in FIG. 6. However, in accordance with the first exemplary embodiment, even when the dielectric film 2 is thin, the undercut U shown in Step (E') in FIG. 6 does not occur, thereby leading to a very low risk of short circuiting. Furthermore, in the first exemplary embodiment, since the storage capacitor 60 is formed eventually, the thinner the dielectric film 2, the better. That is, in accordance with the first exemplary embodiment, the storage capacitor 60 having a relatively large capacitance can also be easily formed.

In addition, when the thickness of the dielectric film 2 is defined as described above, actual lengths L1 to L5 shown in FIG. 2 of the pattern of the semiconductor film 1 in the first exemplary embodiment may be set, such as L1=40 μm, L2=L3=15 μm, and L4=L5=3 μm. In particular, by setting the lengths L4 and L5, that is, the actual size of the smooth intersection 1K, as described above, relative to the foregoing thickness of the dielectric film 2, the risk of producing the undercut U can be reduced or minimized.

In the above-described first exemplary embodiment, it is assumed that an undercut is formed by the light etching process before depositing the dielectric film 2 on the semiconductor film 1. However, it is possible to apply or utilize the patterning configuration, including a "smooth intersection" similar to the foregoing smooth intersection, in all steps, such as the etching step (a part of Step (C) in FIG. 4) to perform patterning of the semiconductor film 1, in which there is a likelihood of forming the undercut U, as shown in Step (E') in FIG. 6, and when this is done, substantially the same advantage as described above can be obtained.

Also, in the above description, although only the smooth intersection 1K shown in FIGS. 1 and 2 is formed so as to provide a smooth connection, the present invention is not limited to such a configuration. As long as a pattern similar to that of the semiconductor film 1 and the extension 1f shown in FIGS. 1 and 2 is formed, a variety of modified configurations such as those shown in FIGS. 7 to 9 can be considered.

Figure 7:
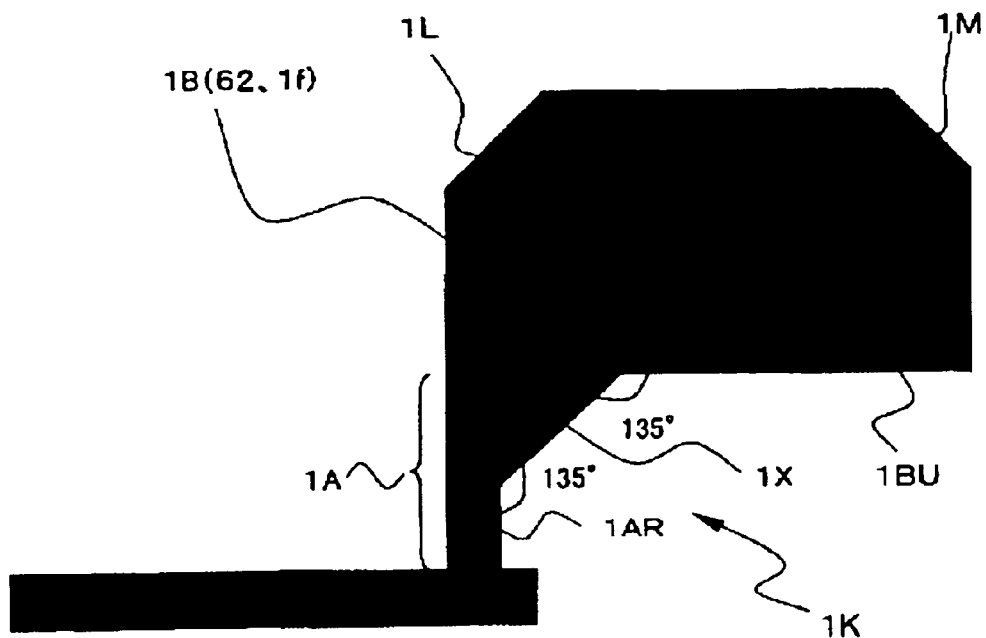
FIG. 7 is a plan view illustrating another configuration of a pattern of the semiconductor film, in which other intersections are transformed so as to provide a smooth connection in addition to the smooth intersection shown in FIG. 2.

In FIG. 7, in addition to the smooth intersection 1K, smooth intersections 1L and 1M are also formed so as to provide a smooth connection in place of right-angled intersections in the pattern shown in FIG. 2. It is obvious that it is useful to transform such portions so as to provide a smooth-connecting configuration since the foregoing problems can also be avoided at the smooth intersections 1L and 1M. In this case, the "inner corner" has an angle of 135°. Also, those skilled in the art will appreciate that more generally similar measures may also be applied to other right-angled portions in FIG. 7, such as those of the semiconductor film 1 which will become the TFT 30.

Figure 8:
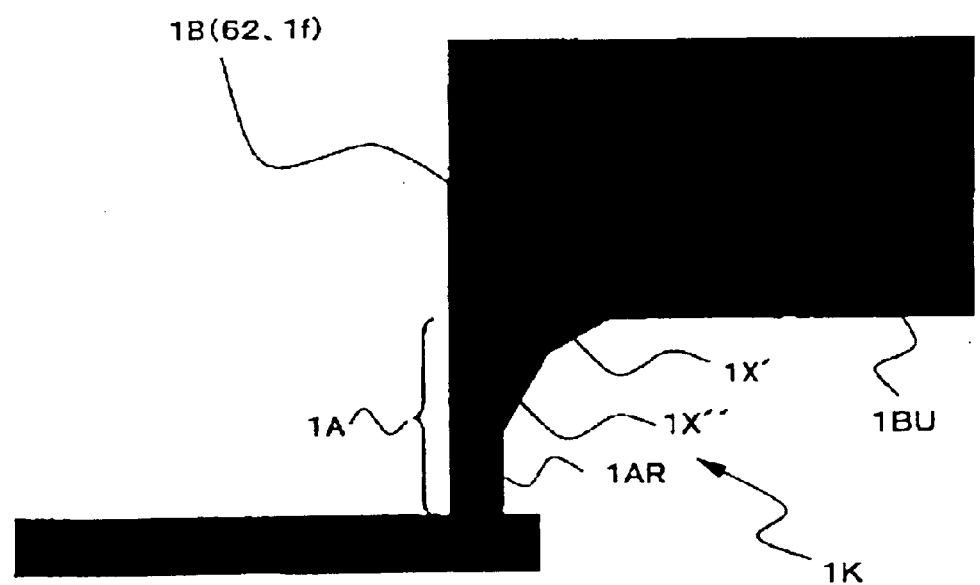
FIG. 8 is a plan view illustrating another configuration of a pattern of the semiconductor film, in which the smooth intersection shown in FIG. 2 is transformed by a plurality of line segments so as to provide a smooth connection.

Although the smooth intersection 1K shown in FIG. 2 is formed by only three line segments, i.e., the right side 1AR, the lower side 1BU, and the additional line segment 1X, the smooth intersection 1K shown in FIG. 8 is formed by four line segments, i.e., other additional line segments 1X' and 1X" in addition to the right side 1AR and the lower side 1BU. As is obvious from the figure, this configuration provides a smoother connection.

In FIG. 8, all angles formed between the lower side 1BU and the other line segment 1X", between the right side 1AR and the other line segment 1X', and between the other line segments 1X' and 1X" are set to be about 150°. In the case in which the "angle" is set to be greater than 135°, even when the foregoing dielectric film 2 has a thickness equal to or less than 50 nm, the risk of short circuiting between the two electrodes forming the storage capacitor 60 can be reduced.

Figure 9:
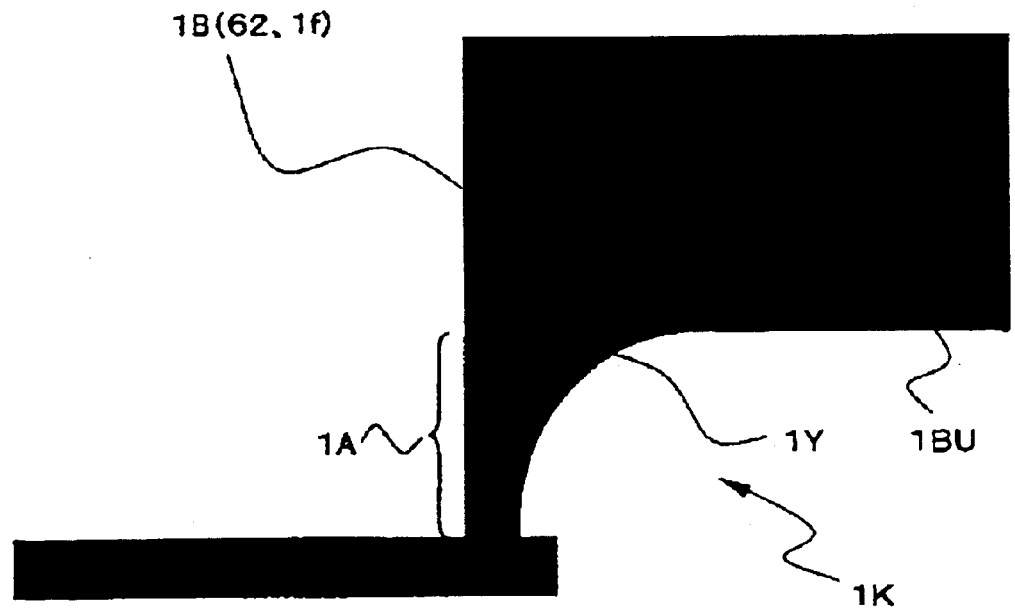
FIG. 9 is a plan view illustrating another configuration of a pattern of the semiconductor film, in which the smooth intersection shown in FIG. 2 is transformed by an arc so as to provide a smooth connection.

Furthermore, in FIG. 9, the smooth intersection 1K includes an arc 1Y as an example of a curved line. This is the ultimate configuration for providing a "smooth" connection.

It will be apparent to those skilled in the art that the feature which is particular to the present invention and in which the risk of forming the foregoing undercut U can be reduced and accordingly the risk of short circuiting between the extension 1f and the upper electrode 61 can be reduced is achieved in substantially the same manner, or more effectively, in any of these modified configurations.

Figure 10:
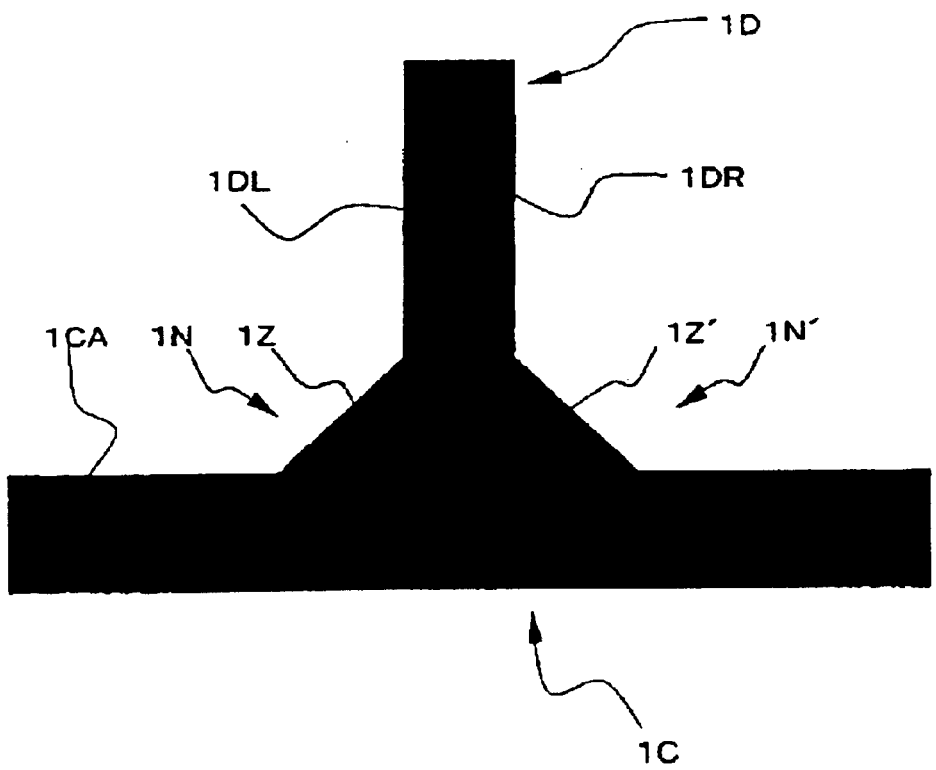
FIG. 10 is a plan view illustrating a projected pattern, different from those in FIGS. 2, and 7 to 9, including intersections to provide a smooth connection.

The present invention is not limited to the above-described patterns and the pattern of the semiconductor film 1 shown in FIGS. 1 and 2. The present invention is also applicable to various other assumable patterns in the same manner. One example is shown in FIG. 10. This is a typical example of a pattern having the foregoing "projected shape", in which additional line segments 1Z and 1Z' lie respectively between an upper side 1CA of one rectangular pattern 1C which extends horizontally, and left and right sides 1DL and 1DR of another rectangular pattern 1D, which extends vertically and which is orthogonal to the one rectangular pattern 1C. With this configuration, smooth intersections 1N and 1N' are formed so as to provide a smooth connection.

In FIG. 1, such a shape can be seen in the scanning line 3a. That is, when the scanning line 3a extending horizontally and a part projecting from the scanning line 3a so as to become the gate electrodes are viewed in FIG. 1, these include a pattern similar to the pattern shown in FIG. 10 as the fundamental element thereof.

Figure 11:
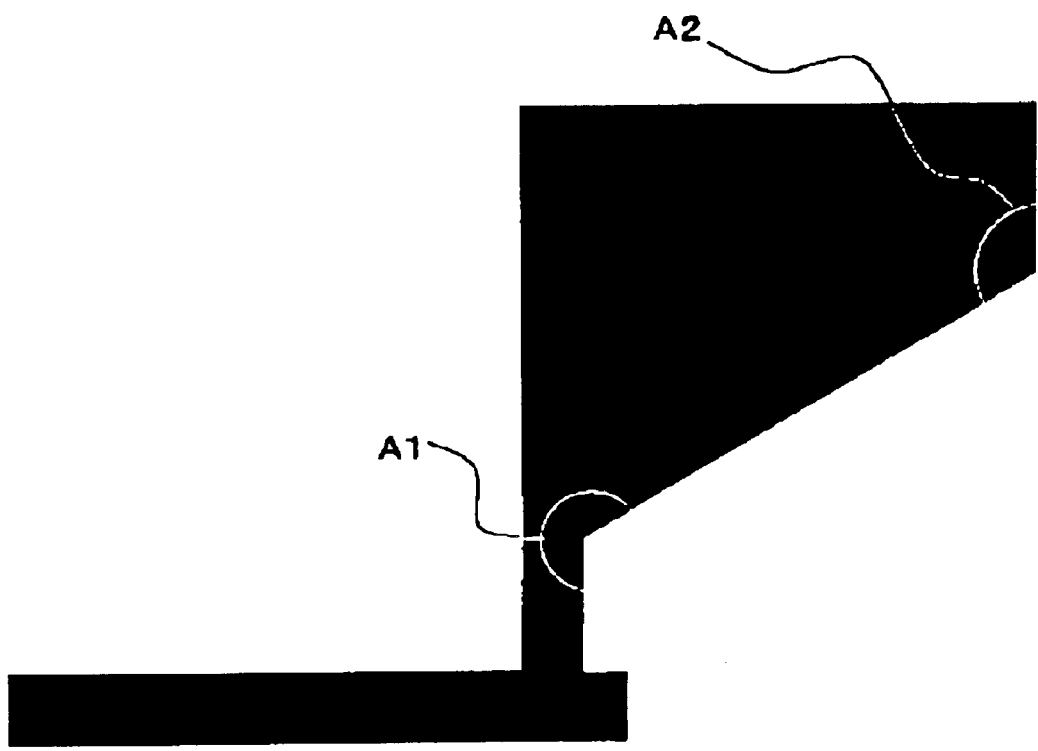
FIG. 11 is a plan view illustrating a projected pattern, different from those in FIGS. 2, and 7 to 10, including intersections to provide a smooth connection.

Moreover, the present invention includes the configuration described below. That is, the configuration provides a pattern including at least two outer corners including a first outer corner which has an interior angle greater than 180° and less than 270° and a second outer corner which lies next to the first outer corner and has an interior angle greater than 90° and less than 180°. An actual example of this configuration is shown in FIG. 11. In FIG. 11, an angle (or interior angle) of an inner corner next to an outer corner, denoted by reference character A1, is greater than 180° and less than 270°. Also, another angle (or interior angle) of an inner corner next to another outer corner, denoted by reference character A2, is greater than 90° and less than 180°. In addition, these outer corners A1 and A2 are next to each other. Even in such a case, the risk of forming the foregoing undercut U can be reduced and accordingly the risk of short circuiting between the extension and the upper electrode can be reduced.

Second Exemplary Embodiment

Next, in a second exemplary embodiment, a more specific configuration including the TFT 30 and the storage capacitor 60 described in the first exemplary embodiment as components of an electro-optical device is described below. In the following description of this exemplary embodiment, the electro-optical device is applied to a liquid-crystal display device.

(Basic Structure of Electro-optical Device)

Figure 12:
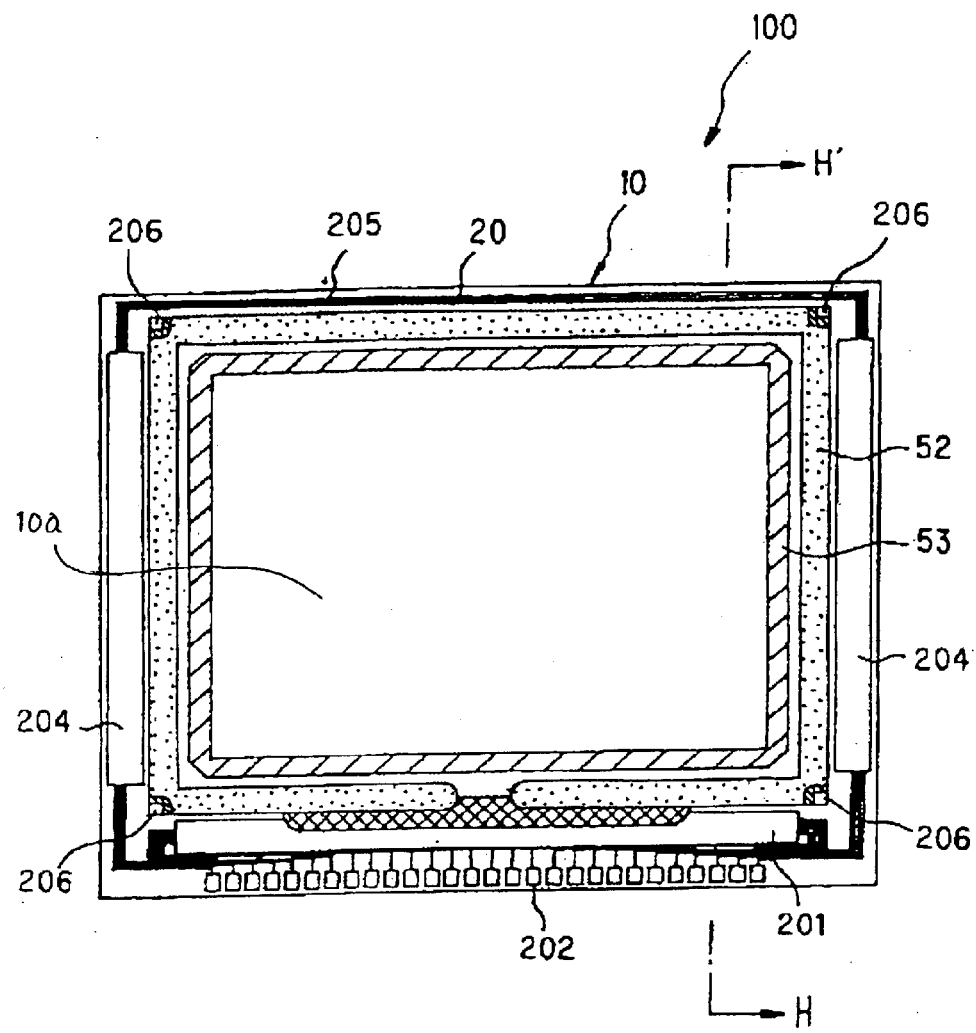
FIG. 12 is a plan view illustrating a TFT array substrate, together with components formed thereon, viewed from a counter substrate, in an electro-optical device according to a second exemplary embodiment of the present invention.
Figure 13:
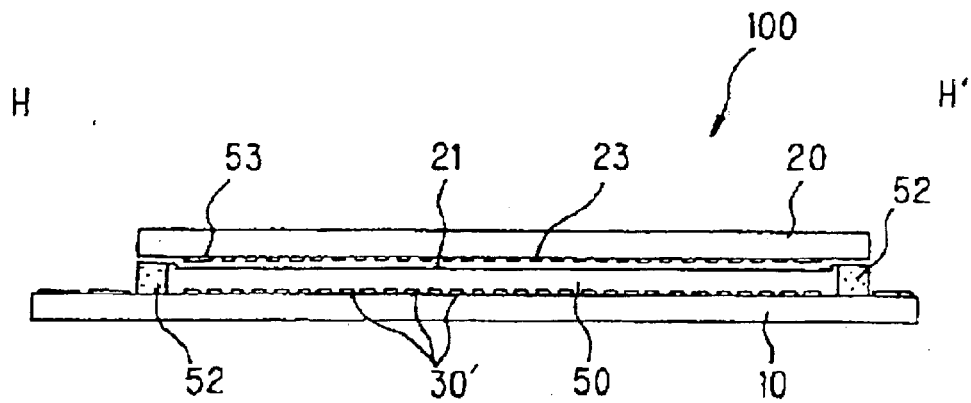
FIG. 13 is a sectional view taken along plane H–H' indicated in FIG. 12.
Figure 14:
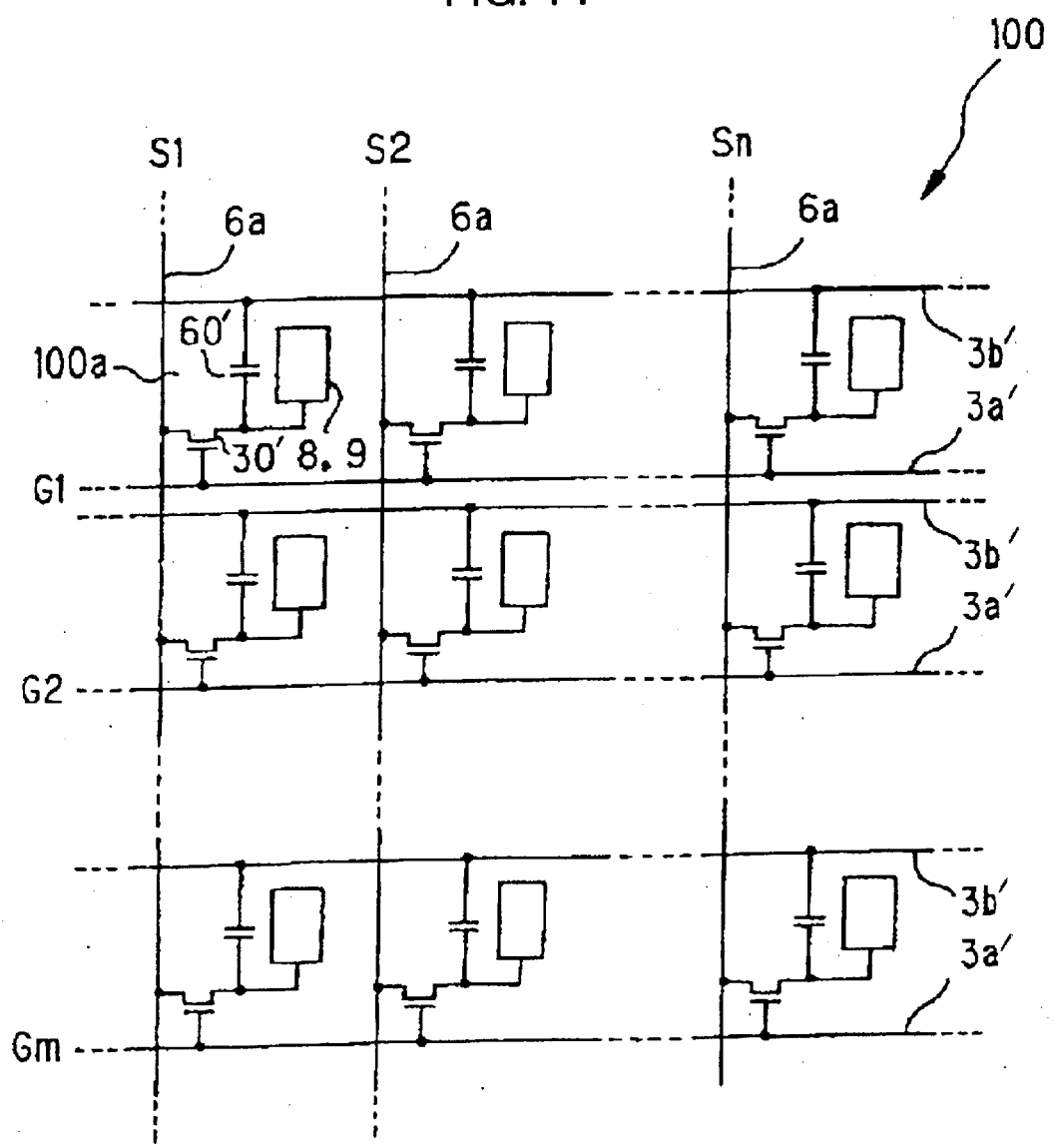
FIG. 14 is a schematic circuit diagram of various elements, wiring lines, and so forth disposed in a plurality of pixels in a matrix array which forms an image display region of the electro-optical device according to the second exemplary embodiment of the present invention.

Referring now to FIGS. 12 to 14, the basic structure of the liquid-crystal display device according to the second exemplary embodiment is described below. FIG. 12 is a plan view illustrating a TFT array substrate, together with components formed thereon, viewed from a counter substrate. FIG. 13 is a sectional view taken along plane H–H' indicated in FIG. 12. Also, FIG. 14 is a schematic circuit diagram of various elements, wiring lines, and so forth disposed in a plurality of pixels, formed in a matrix array, which forms an image display region of the electro-optical device.

In FIGS. 12 and 13, in the electro-optical device according to the second exemplary embodiment, a TFT array substrate 10 and a counter substrate 20 are disposed so as to oppose each other.

The TFT array substrate 10 and the counter substrate 20 have the liquid crystal 50 filled therebetween, and the TFT array substrate 10 and the counter substrate 20 are bonded to each other with a sealant 52 disposed along a sealing region surrounding an image display region 10a.

In order to bond the foregoing two substrates to each other, the sealant 52 composed of, for example, a thermosetting resin, a thermosetting and photo-curable resin, a photo-curable resin, an ultraviolet-curable resin, or the like, is cured by heat, heat and light, light, ultraviolet illumination, or the like, respectively, after being applied to the TFT array substrate 10 in the manufacturing process.

Such a sealant 52 has gap particles, such as glass fiber particles or glass beads, mixed therein so as to maintain a predetermined gap between the two substrates. In other words, the electro-optical device according to the second exemplary embodiment is suitable for use in a compact, magnifying light valve of a projector. When the electro-optical device is used as a large liquid crystal device, such as a liquid crystal display device or a liquid crystal TV, which provides 1× magnification display, the gap particles may be included in the liquid crystal 50.

In the region outside the sealant 52, a data-line drive circuit 201 to drive the data lines 6a by supplying image signals to the data lines 6a with a predetermined timing and external-circuit connecting terminals 202 are disposed along one side of the TFT array substrate 10, and two scanning-line drive circuits 204 for driving scanning lines 3a' by supplying scanning signals to the scanning lines 3a' with a predetermined timing are disposed along the two sides adjacent to the one side.

Those skilled in the art will appreciate that the scanning-line drive circuits 204 may be disposed along only one of the two sides when the scanning signals supplied to the scanning lines 3a' are not significantly delayed. Also, the data-line drive circuit 201 may be disposed along the two mutually opposing sides of the image display region 10a.

A plurality of wiring lines 205 to mutually connect the two scanning-line drive circuits 204 disposed along both sides of the image display region 10a is disposed along the remaining side of the TFT array substrate 10. Also, an electrical conducting member 206 to electrically connect the TFT array substrate 10 and the counter substrate 20 is provided at at least one corner of the counter substrate 20. As shown in FIG. 13, the counter substrate 20 having substantially the same profile as the sealant 52 shown in FIG. 12 is firmly fixed to the TFT array substrate 10 with the sealant 52.

Also, as shown in FIG. 13, on the TFT array substrate 10, an alignment film is formed on pixel electrodes on which TFTs 30' used to switch pixels and wiring lines, such as the scanning lines and the data lines, have been formed. On the other hand, the counter substrate 20 has counter electrodes 21 and another alignment film formed in its uppermost layer. Also, the liquid crystal 50 is composed of, for example, a single type or several types of mixed nematic liquid crystal and is aligned in a predetermined state between the pair of alignment films.

In the image display region 10a of an electro-optical device 100 having the above-described structure, a plurality of pixels 100a is formed in a matrix array, as shown in FIG. 14.

As shown in FIG. 14, in each of the plurality of pixels 100a, the transparent and reflective electrodes 8 and 9 (hereinafter "pixel electrodes 8 and 9" in combination) and the TFT 30' used for a switching control of the pixel electrodes 8 and 9 are formed. The data line 6a to supply image signals is electrically connected to a source of each TFT 30'. Image signals S1, S2, - - - , Sn, which are written to the data lines 6a, may be sequentially supplied to the data lines 6a in that order, or may be supplied to each group of the plural data lines. 6a lying next to each other.

Also, the scanning line 3a' is electrically connected to a gate of each TFT 30', and pulse scanning signals G1, G2, - - - , Gm are sequentially applied to the scanning lines 3a' with a predetermined timing in that order. The pixel electrodes 8 and 9 are electrically connected to a drain of the corresponding TFT 30', and by switching on the TFT 30' serving as a switching element for a fixed period of time, the image signals S1, S2, - - - , Sn supplied from the data line 6a are written to these electrodes.

The image signals S1, S2, - - - , Sn, which have a predetermined level and which are written to the liquid crystal, as an example electro-optical substance, via the pixel electrodes 8 and 9, are held for a fixed period of time between the pixel electrodes and the counter electrodes formed on the counter substrate. Since the alignment and the order of molecular association of the liquid crystal vary in accordance with the applied voltage level, the liquid crystal can modulate light and achieve a gradation display. Since the transmittance of the liquid crystal with respect to incident light decreases in accordance with the voltage applied to each pixel in a normally white mode, and the transmittance of the liquid crystal with respect to incident light increases in accordance with the voltage applied to each pixel in a normally black mode, the whole electro-optical device transmits light having a contrast depending on the image signals.

In order to reduce or prevent leakage of the held image signals, a storage capacitor 60' is connected in parallel with a liquid crystal capacitance formed between the pixel electrodes 8 and 9 and the counter electrode. The storage capacitor 60' is disposed parallel to the corresponding scanning line 3a' and includes a capacitor electrode at a fixed potential side and a capacitor line 3b' fixed at a constant potential. It will be appreciated by those skilled in the art that the storage capacitor 60' corresponds to the storage capacitor 60 in the above-mentioned first exemplary embodiment. Also, a similar correspondence applies to the capacitor line 3b'.

(Structure of TFT Array Substrate)

Figure 15:
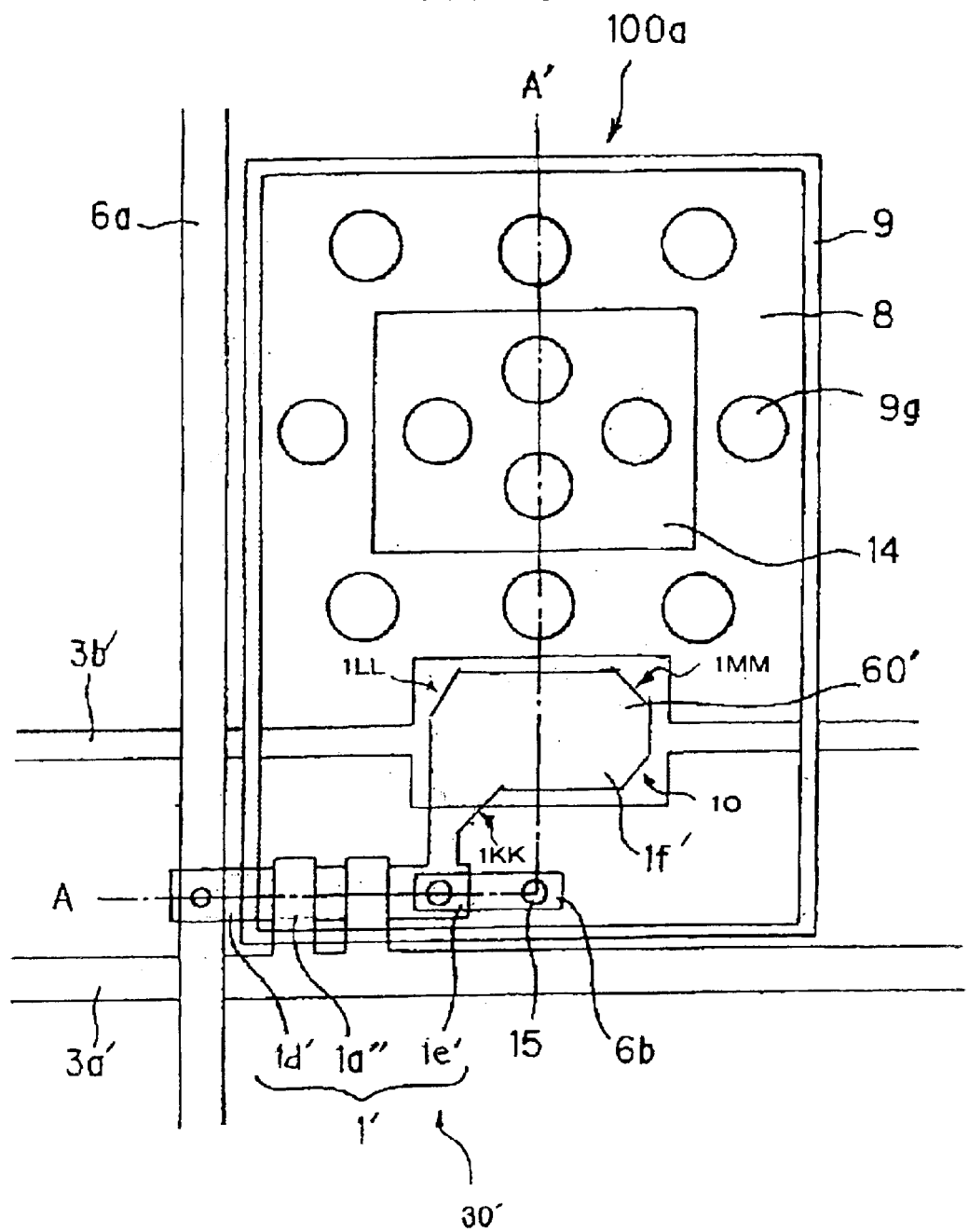
FIG. 15 is a partial plan view illustrating a plurality of mutually neighboring pixel groups of the TFT array substrate, including data lines, scanning lines, pixel electrodes, and so forth formed thereon, of the electro-optical device according to the second exemplary embodiment of the present invention.
Figure 16:
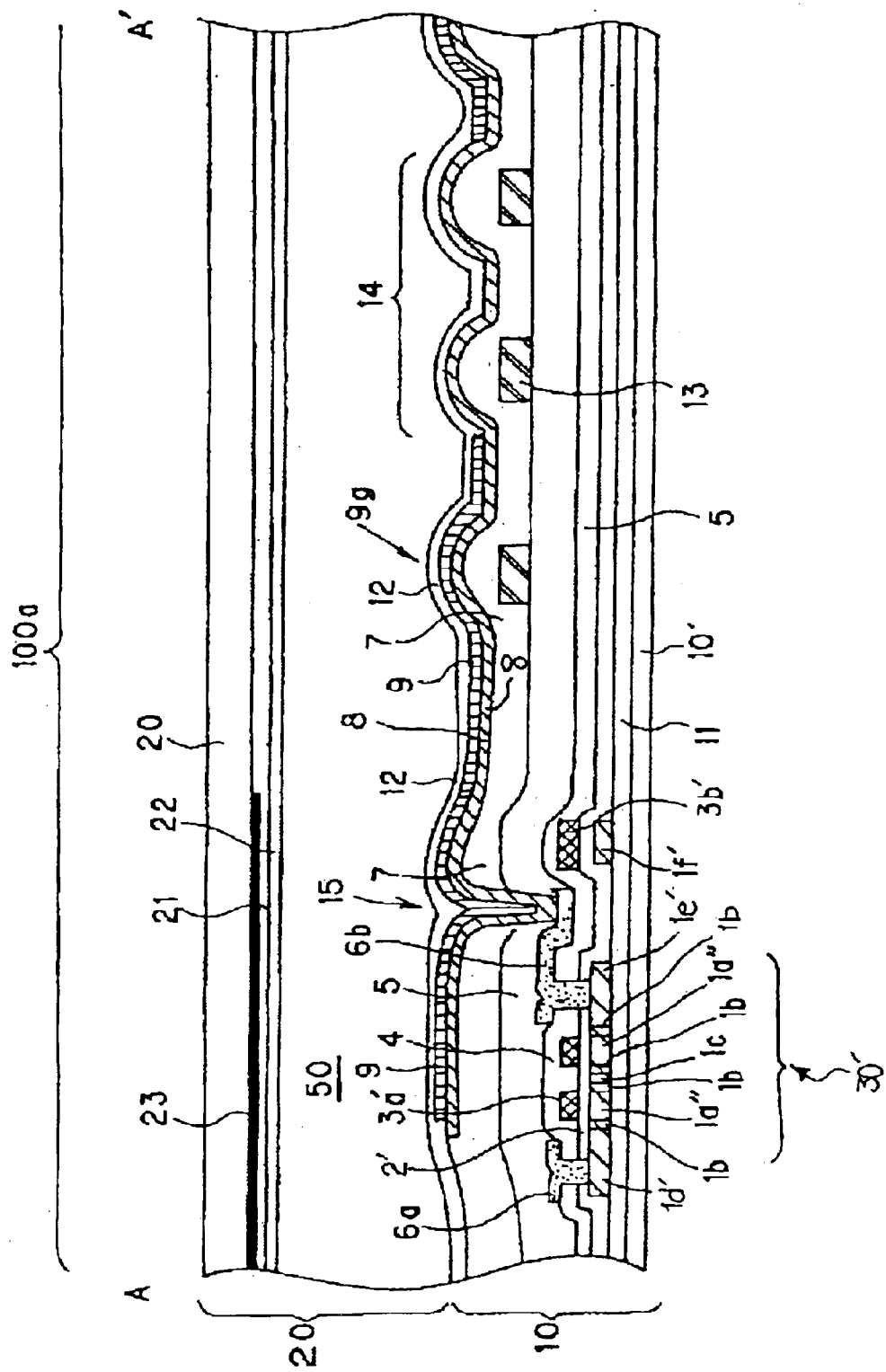
FIG. 16 is a sectional view taken along plane A–A' indicated in FIG. 15.

FIG. 15 is a partial plan view illustrating a plurality of neighboring pixel groups of the TFT array substrate used in the second exemplary embodiment. FIG. 16 is a sectional view of one pixel taken along plane A–A' indicated in FIG. 15. Here, FIG. 15 shows only one pixel.

In FIG. 15, the reflective electrodes 9, made from a laminated film of aluminum, silver, an alloy of these two metals, titanium, titanium nitride, molybdenum, tantalum, or the like, are formed in a matrix array on the TFT array substrate, and the TFTs 30' used to switch the pixels are electrically connected to the corresponding reflective electrodes 9 via the corresponding transparent electrodes 8. Also, the data line 6a, the scanning line 3a' and the capacitor line 3b' are formed along the vertical and horizontal boundaries of the region forming the corresponding reflective electrode 9, and the TFT 30' is connected to the corresponding data and capacitor lines 6a and 3b'. That is, the data line 6a is electrically connected to the highly doped source region 1d' of the corresponding TFT 30' via a contact hole and the transparent electrode 8 is electrically connected to the highly doped drain region 1e' of the corresponding TFT 30' via another contact hole 15 and the source line 6b. Also, the scanning line 3a' extends so as to oppose channel regions 1a' of the corresponding TFT 30'.

The storage capacitor 60' has a structure in which a conductive extension 1f of the semiconductor film 1 for forming the TFTs 30' used to switch the pixels serves as a lower electrode and the capacitor line 3b' lying in the same layer as the scanning line 3a' serves as an upper electrode so that these electrodes overlap with each other. These upper and lower electrodes correspond to the upper and lower electrodes 61 and 62 in the above-mentioned first exemplary embodiment. That is, the lower electrode is formed together with the semiconductor film 1 forming the foregoing TFT 30', and the upper electrode is formed on the lower electrode with the dielectric film (the same film as the "gate-insulating film", which is described below, and hereinafter "dielectric film" and the "gate-insulating film" are denoted by the same reference numeral "2'") disposed therebetween.

In particular, as shown in FIG. 15, the extension 1f and a smooth intersection 1KK which forms the pattern of the lower electrode provide a smooth connection in a similar manner to that shown in FIG. 2. Furthermore, the pattern shown in FIG. 15 includes smooth intersections 1LL and 1MM, which also provide a smooth connection in a similar manner to that shown in FIG. 7, and an additional smooth intersection 1O also providing a smooth connection.

As shown in FIG. 15, in each of the pixels 100a having the above-described structure, the reflective electrode 9 having a transmissive window 14 is formed, and a bumps-dips layer 7 (not shown in FIG. 15) is formed on the entire surface of the reflective electrode 9. The region corresponding to the transmissive window 14 is covered by the transparent electrode 8 and serves as a transmissive region for use in displaying an image in a transmissive mode. The remaining region serves as a reflective region including a bumps-dips forming layer, which is described below, the bumps-dips layer 7, and the reflective electrode 9, and the remaining region is used to display an image in a reflective mode.

As shown in the cross-section of the reflective region in FIG. 16 taken along plane A–A' indicated in FIG. 15, an underlying protective film 11 made from a silicon oxide film (an insulating film) having a thickness in the range from 100 to 500 nm is formed on the surface of the glass substrate 10' used for the transparent TFT array substrate and serving as a base of the TFT array substrate 10, and an island-shaped semiconductor film 1' having a thickness in the range from 30 to 100 nm is formed on the surface of the underlying protective layer 11. A gate-insulating film 2' made from a silicon oxide film having a thickness in the range from about 50 to 150 nm is formed on the surface of the semiconductor film 1', and the scanning line 3a' which has a thickness in the range from 300 to 800 nm and parts of which form gate electrodes extends on the surface of the gate-insulating film 2'.

The regions of the semiconductor film 1' opposing the scanning line 3a', with the gate-insulating film 2' interposed therebetween, are the channel regions 1a". With respect to the two channel regions 1a", a source region including a lightly doped region 1b and the highly doped source region 1d' is formed on one side, a drain region including another lightly doped region 1b and the highly doped drain region 1e' is formed on the other side, and a highly doped region 1c which does not belong to the source and drain regions is formed therebetween.

A first interlayer insulating film 4 made from a silicon oxide film having a thickness in the range from 300 to 800 nm and a second interlayer insulating film 5 (a surface protective film) made from a silicon nitride film having a thickness in the range from 100 to 800 nm are formed on the surface of the TFT 30' used to switch the pixel. However, the second interlayer insulating film 5 need not be formed if it is not required. The data line 6a having a thickness in the range from 300 to 800 nm is formed on the surface of the first interlayer insulating film 4, and the data line 6a is electrically connected to the highly doped source region 1d' via the contact hole formed in the first interlayer insulating film 4.

A bumps-dips forming layer 13 and the bumps-dips layer 7, both being composed of a photosensitive resin such as an organic resin, are formed above the second interlayer insulating film 5 in that order, the transparent electrode 8 composed of an ITO film or the like is then formed on the surface of the bumps-dips layer 7, the reflective electrode 9 made from a laminated film of aluminum, silver, an alloy of these metals, titanium, titanium nitride, molybdenum, tantalum, or the like is further formed on the transparent electrode 8. A bumps-dips pattern 9g corresponding to the bumps-dips shape of the surface of the bumps-dips layer 7 is formed on the surface of the reflective electrode 9.

The reflective electrode 9 and the transparent electrode 8 are electrically connected to the source line 6b via the contact hole 15. The transmissive window 14 through which light from a backlight source is transmitted is formed on the surface of the reflective electrode 9.

An alignment film 12 made from a polyimide film is formed on the surfaces of the reflective electrode 9 and the transparent electrode 8 serving as the uppermost layer of the transmissive window 14. The surface of the alignment film 12 is subjected to a rubbing treatment.

Also, the storage capacitor 60' is formed such that the capacitor line 3b', which serves as the upper electrode and which lies in the same layer as the scanning line 3a', opposes the extension 1f', which serves as the lower electrode and which extends from the highly doped drain region 1e', with an insulating film (including a dielectric film 2'—refer to FIGS. 4(A)–4(C)), which is formed together with the gate-insulating film 2', interposed therebetween.

Preferably, the TFT 30' has an LDD (lightly doped drain) structure as described above. However, it may have an offset structure in which impurity ions are not implanted into the region corresponding to the lightly doped regions 1b. Alternatively, the TFT 30' may be of a self-aligning type in which highly doped impurity ions are implanted by using the gate electrodes, serving as part of the scanning line 3a', as a mask so as to form highly doped source and drain regions in a self-aligning manner.

In the second exemplary embodiment, although the TFT 30' has a dual-gate structure including the two gate electrodes disposed between the source and drain regions, alternatively, it may have a single-gate structure including a single gate electrode, or a multi-gate structure including three or more gate electrodes. When a plurality of gate electrodes are disposed, the same signal is applied to all gate electrodes. When the TFT 30' has such a dual-gate or multi-gate structure, current leakage at the junction between channels and the source and drain regions can be reduced or prevented and an off-state current can be reduced. When at least one of these gate electrodes has the LDD structure or the offset structure, the off-state current can be further reduced, resulting in a stable switching element.

In FIGS. 15 and 16, in the reflective region of each pixel 100a, the TFT array substrate 10 has the above-described bumps-dips pattern 9g formed in a region (a bumps-dips forming region) of the surface of the reflective electrode 9, the region lying outside the region for forming the TFT 30' and the contact hole 15.

In order to form such a bumps-dips pattern 9g, in the foregoing bumps-dips forming region of the TFT array substrate 10 according to the second exemplary embodiment, the bumps-dips forming layer 13, which is made from a transmissive and photosensitive resin composed of an organic material, such as an acrylic resin, is formed on the surface of the second interlayer insulating film 5 by, for example, spin coating so as to have a thickness in the range from 1 to 3 μm, and the bumps-dips layer 7 serving as an insulating film made from a fluid material, such as a transmissive and photosensitive resin composed of an organic material, such as an acrylic resin is laminated by, for example, spin coating, on the bumps-dips forming layer 13 so as to have a thickness in the range from 1 to 2 μm.

The bumps-dips forming layer 13 has a large number of bumps and dips formed therein. Accordingly, as shown in FIG. 16, the bumps-dips pattern 9g corresponding to the bumps-dips shape of the surface of bumps-dips layer 7 is formed on the surface of the reflective electrode 9 so that the bumps-dips layer 7 does not cause the shape of any edge or the like of the bumps-dips forming layer 13 to be formed in the bumps-dips pattern 9g. Instead of forming the bumps-dips layer 7, the edges of bumps and dips of the bumps-dips forming layer 13 may be smoothed by baking after the bumps-dips forming layer 13 is formed.

(Operation of Electro-optical Device)

In the electro-optical device 100 having the above-described structure according to the second exemplary embodiment, since the reflective electrodes 9 are formed, incident light from the counter substrate 20 is reflected at the TFT array substrate 10 and is emitted from the counter substrate 20. With this arrangement, when the light incident on each pixel 100a is modulated by the liquid crystal 50, a desired image can be displayed using external light (a reflective mode).

Also, as shown in FIGS. 15 and 16, the electro-optical device 100 also functions as a transmissive liquid-crystal display device since the transparent electrodes 8 are formed so as to cover the transmissive windows 14 formed in the same layer as the reflective electrodes 9. More particularly, light emitted from a backlight unit (not shown) disposed behind the TFT array substrate 10 is incident on the TFT array substrate 10, passes through the transmissive region at each pixel 100a, which lies in the same layer as the reflective electrode 9 and which has no reflective electrode 9 formed therein, that is, it passes through the transmissive window 14 at each pixel 100a covered by the transparent electrode 8, and is then transmitted through the counter substrate 20. With this arrangement, when the light incident on each pixels 100a is modulated by the liquid crystal 50, a desired image can be displayed using light emitted from the backlight unit (not shown) (a transmissive mode).

In particular, in the electro-optical device 100 according to the second exemplary embodiment, since the lower electrode forming the storage capacitor 60' is formed so as to have a pattern including the smooth intersection 1KK, etc. in a similar fashion to that in the foregoing first exemplary embodiment, when the lower electrode is formed by photolithography, the undercut U described in the first exemplary embodiment is not produced below the lower electrode. Accordingly, since the surface of the lower electrode is not exposed, even when the upper electrode is formed, the risk of short circuiting between these electrodes can be reduced.

With this arrangement, in the second exemplary embodiment, the storage capacitors 60' fully perform the originally designed features and functions thereof, thereby leading to an accurate operation of the electro-optical device.

(Manufacturing Method)

Figure 17:
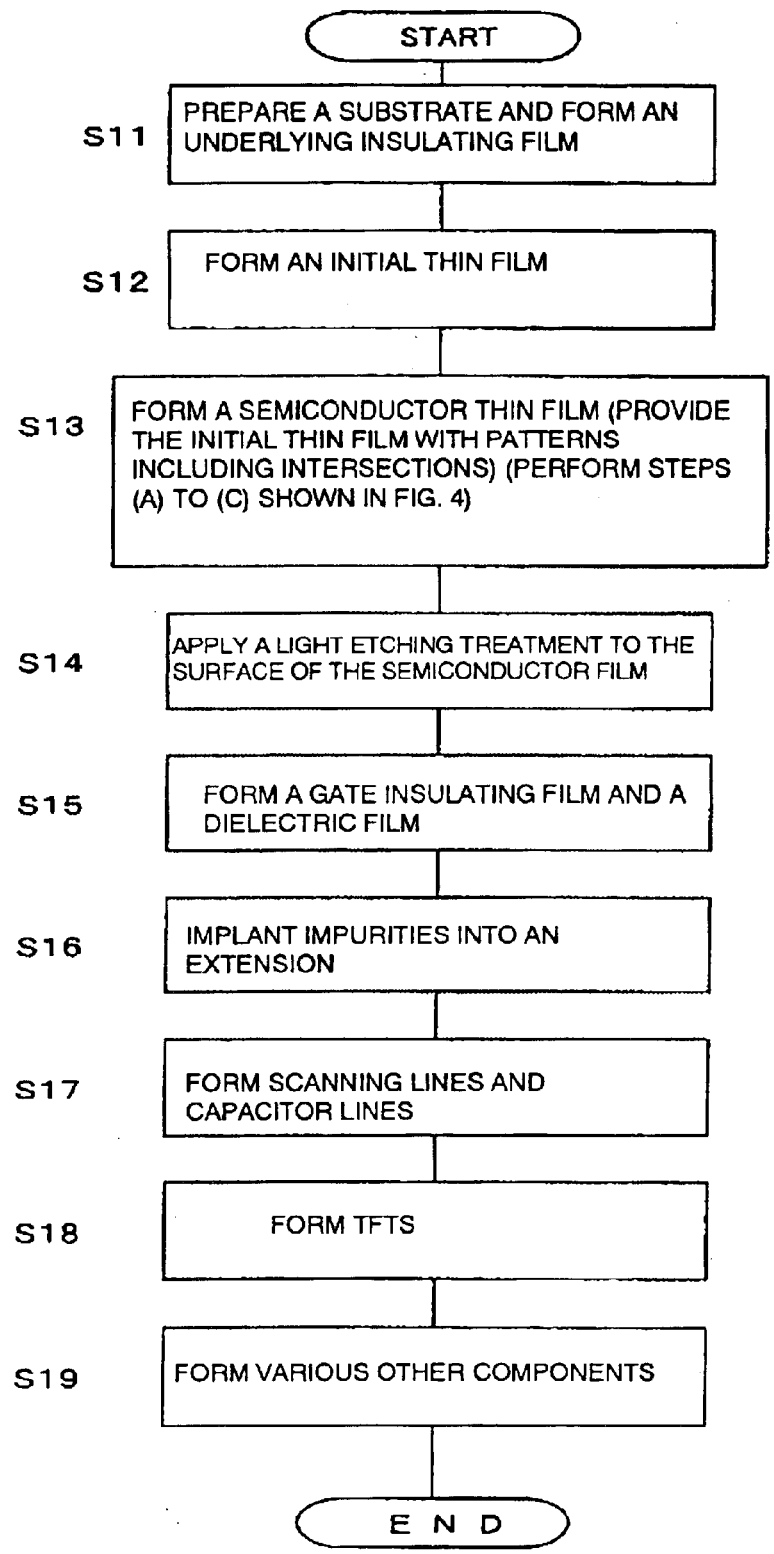
FIG. 17 is a flowchart illustrating a method of manufacturing the electro-optical device according to the second exemplary embodiment.

A method of manufacturing the TFT array substrate 10 is described below with reference to a flowchart shown in FIG. 17.

First, the glass substrate 10' which is to be used for the TFT array substrate and which has been cleaned by ultrasonic cleaning or the like is prepared, and then, at a substrate temperature in the range from 150 to 450° C., the underlying protective layer 11 made from a silicon oxide film is formed on the entire surface of the glass substrate 10' by plasma CVD so as to have a thickness in the range from 100 to 500 nm. An exemplary source gas used in this step is a mixed gas including monosilane gas and laughing gas (nitrous oxide), TEOS (tetraethoxysilane: Si $(Si(OC_2H_5)_4)$ and oxygen gases, or disilane and ammonia gases (Step S11).

Then, at a substrate temperature in the range from 150 to 450° C., an initial thin film of the semiconductor films 1' made from an amorphous silicon film is formed on the entire surface of the glass substrate 10' to be used for the TFT array substrate by plasma CVD so as to have a thickness in the range from 30 to 100 nm. An exemplary source gas used in this step is disilane or monosilane gas. Next, this initial thin film is irradiated with laser light so as to be subjected to laser annealing. As a result, the amorphous initial thin film is first dissolved and is then crystallized during the cooling solidification process so as to become a polycrystalline silicon film (Step S12). In this step, since the laser light is radiated on regions of the initial thin film for a very short period of time, and also since the radiated regions only share local parts of the whole substrate, the whole substrate is not heated at the same time and thus does not reach a high temperature. Therefore, even though a glass substrate or the like is used for the TFT array substrate, heat does not cause deformation, cracking, or the like.

Next, the semiconductor films 1' (an active layer) having the individual island-shaped patterns lying separately from each other are formed on the surface of the initial thin film by etching the initial thin film by photolithography with a resist film interposed therebetween (Step S13). This step may be conducted in the same manner as Steps (A) to (C) illustrated in FIG. 4. That is, by applying the exposing step to the resist film using a reticle whose transmissive and non-transmissive portions are formed so as to include patterns having the smooth intersections 1KK, 1LL, 1MM, and 1O according to the second exemplary embodiment, the initial thin film is formed as patterns including the smooth intersection 1KK, etc. and becomes the semiconductor films 1'.

Next, after the foregoing resist film is peeled off; a light etching treatment using a diluted hydrofluoric acid solution is performed so as to clean the surface of the semiconductor film 1' (Step S14). With this treatment, a part of the surface, having no semiconductor film 1' laminated thereon, of the glass substrate 10' is lightly etched. In the second exemplary embodiment, since the light etching treatment as illustrated in Step (E) shown in FIG. 5 and described in the first exemplary embodiment is performed in this step, no undercut U as shown in Step (E') in FIG. 6 is produced below the semiconductor films 1'. This is due to the fact that, as described above, each semiconductor film 1' is formed so as to have a pattern including the smooth intersection 1KK, etc.

Subsequently, at a temperature equal to or lower than 350° C., the gate-insulating film 2' made from a silicon oxide film or the like is formed on the entire surface of the glass substrate 10' and also on the surfaces of the semiconductor films 1' by CVD or the like so as to have a thickness in the range from 10 to 150 nm. An exemplary source gas used in this step is a mixed gas including TEOS and oxygen gases. The gate-insulating film 2' here may be formed from a silicon nitride film in place of a silicon oxide film (Step S15). The dielectric film 2 is also formed together with the gate-insulating film 2'.

Next, by implanting impurity ions into the extensions 1f' of the semiconductor films 1' with a predetermined resist mask placed therebetween, the lower electrodes are formed so as to provide the storage capacitors 60' between the capacitor lines 3b' and the lower electrodes (Step S16).

Next, a metal film, composed of aluminum, tantalum, molybdenum, or the like, to form the scanning lines 3a' and the like, or a dielectric film formed from an alloy film including one of these metals as its main component is formed on the entire surface of the glass substrate 10' to be used for the TFT array substrate by sputtering or the like so as to have a thickness in the range from 300 to 800 nm, and then another resist mask is formed by photolithography. Then, by dry-etching the dielectric film with the resist mask placed therebetween, the scanning lines 3a' (the gate electrodes), the capacitor lines 3b' and so forth are formed (Step S17). In this step, those skilled in the art will appreciate that the upper electrode of each storage capacitor 60' is formed as part of the capacitor line 3b' at the same time. In the second exemplary embodiment, the risk of short circuiting between the capacitor lines 3b' and the corresponding semiconductor films 1' can be reduced or prevented when the capacitor lines 3b' including the above-mentioned upper electrodes are formed. This is due to the fact that, as described above, no undercut is produced below the semiconductor films 1' in the second exemplary embodiment.

Next, each TFT 30' is formed (Step S18) as described in detail below.

First, by implanting lightly doped impurity ions (phosphor ions) with a dosage in the range from about $0.1 \times 10^{13}$ to $10 \times 10^{13}/cm^2$ into the side including the pixel TFT region and an N-channel TFT region (not shown) of the drive circuit, using the scanning line 3a' or the gate electrodes as a mask, the lightly doped regions 1b are formed in a self-aligning manner so as to correspond to the scanning line 3a'. The region having no implanted impurity ion because it lies directly under the scanning line 3a' becomes the channel regions 1a", which are unchanged parts of the semiconductor film 1'.

Next, by implanting highly doped impurity ions (phosphor ions) with a dosage in the range from about $0.1 \times 10^{15}$ to $10 \times 10^{15}/cm^2$ into the pixel TFT region, using a resist mask formed such that its width is greater than the scanning line 3a' (the gate electrode), the highly doped source region 1d', the highly doped region 1c, and the highly doped drain region 1e' are formed.

In place of the foregoing impurity-ion implantation steps, by implanting highly doped impurities (phosphor ions) using the resist mask formed so as to have a width greater than the gate electrode, the source and drain regions having an offset structure may be formed without implanting lightly doped impurities. Alternatively, by implanting highly doped impurities using the scanning line 3a' as a mask, the source and drain regions having a self-aligning structure may be formed.

The foregoing step leads to completion of the TFTs 30'.

Subsequently, the first interlayer insulating film 4, the various contact holes, the data lines 6a, the source lines 6b, the second interlayer insulating film 5, the bumps-dips forming layers 13, the bumps-dips layer 7, the transparent electrodes 8, the reflective electrodes 9, transmissive windows 14, the alignment film 12, and so forth shown in FIGS. 15 and 16 are sequentially formed in accordance with the known art (Step S19), thus leading to completion of the TFT array substrate 10.

Although an active-matrix-driving liquid-crystal display device using TFTs as pixel switching elements is exemplified in all the above described configurations, the present invention is also applicable to an active-matrix-driving liquid-crystal display device using TFDs as pixel switching elements and a passive-matrix-driving liquid-crystal display device, in addition to an electro-optical device using an electro-optical material (for example, an electroluminescent element, a light-emitting diode element, or the like), a plasma display device, and the like, other than the liquid-crystal display devices.

(Electronic Apparatus)

Since the transflective electro-optical devices 100 having the above-described structure can be used as displays of a variety of electronic apparatuses, one such example is described in detail below with reference to FIGS. 18 to 20.

Figure 18:
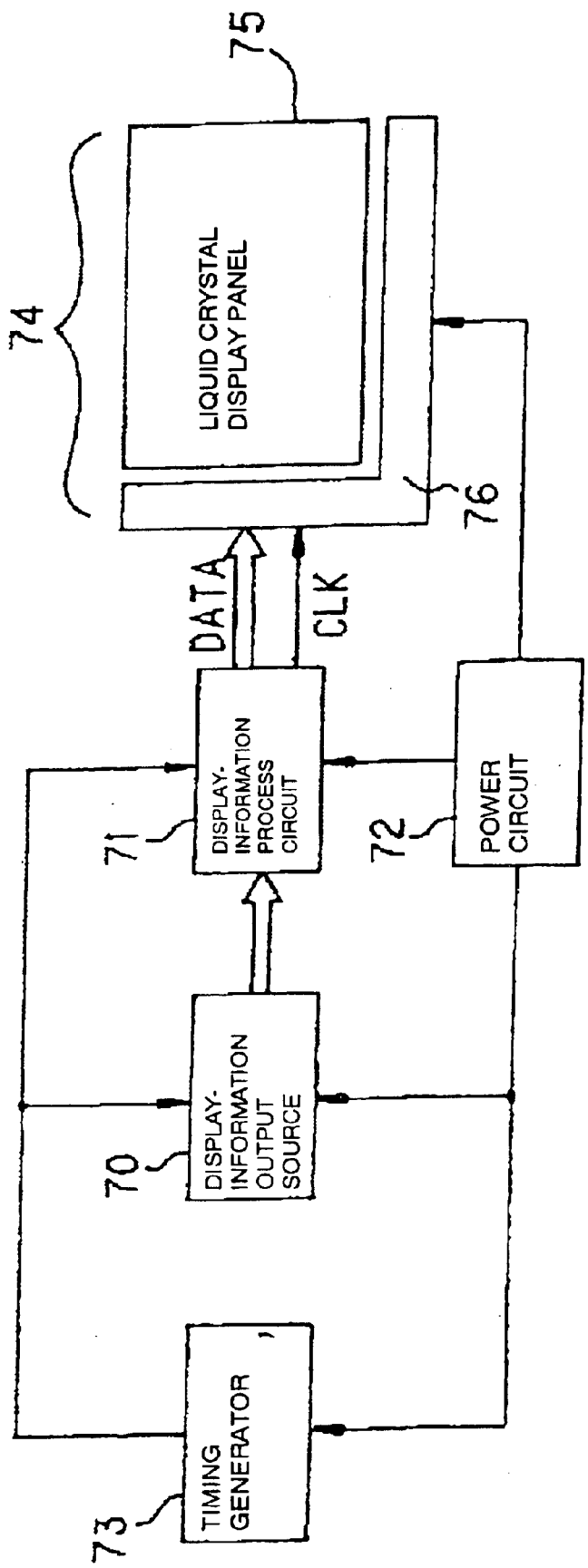
FIG. 18 is a schematic illustrating a circuit configuration of an electronic apparatus using the electro-optical device, according to the present invention, as a display device.

FIG. 18 is a schematic illustrating a circuit configuration of an electronic apparatus using the electro-optical device, according to the present invention, as a display device.

As shown in FIG. 18, the electronic apparatus has a display-information output source 70, a display-information process circuit 71, a power circuit 72, a timing generator 73, and a liquid-crystal display device 74. The liquid-crystal display device 74 has a liquid crystal display panel 75 and a drive circuit 76. The foregoing electro-optical device 100 can be used as the liquid crystal display device 74.

The display-information output source 70 includes a memory, such as a ROM (read only memory), a RAM (random access memory), a storage unit including a variety of disks, a tuning circuit to output tuned digital image signals, and so forth, and sends display information, such as image signals with a predetermined format to the display-information process circuit 71 in response to a variety of clock signals generated by the timing generator 73.

The display-information process circuit 71 has a variety of related art circuits, such as a serial-parallel conversion circuit, an amplification and reversion circuit, a rotation circuit, a gamma correction circuit, and a clamp circuit, processes the input display information, and sends the processed image information together with a clock signal CLK to the drive circuit 76. The power circuit 72 supplies a predetermined voltage to each of the above described components.

Figure 19:
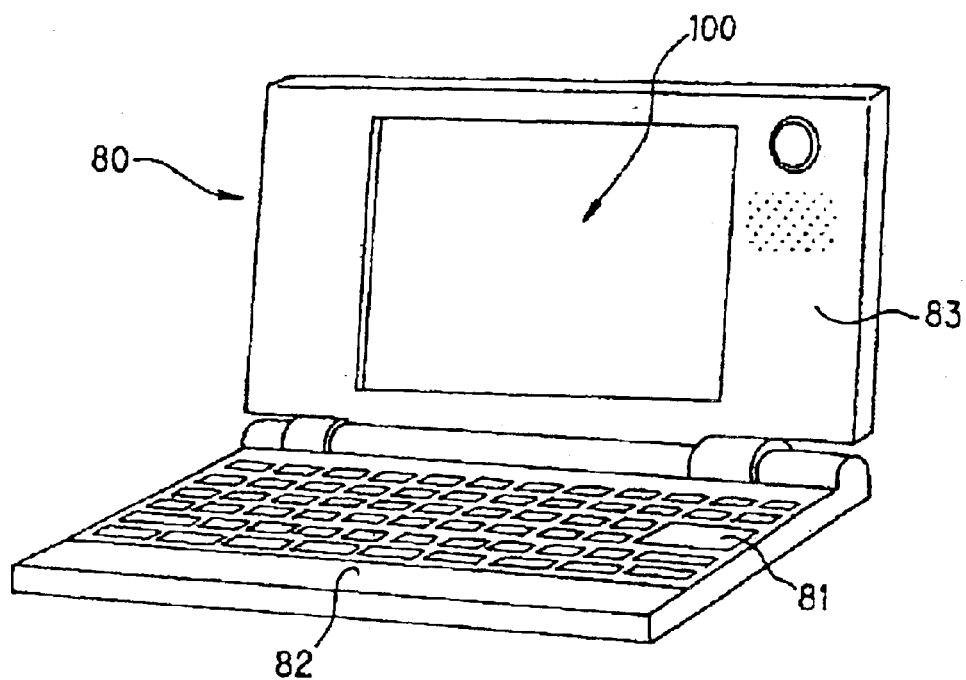
FIG. 19 is a schematic perspective view that a mobile personal computer as an example electronic apparatus using the electro-optical device according to the present invention.

FIG. 19 is a schematic of a mobile personal computer as an example of the electronic apparatus according to the present invention. The personal computer 80 has a main body 82 including a keyboard 81, and a liquid crystal display unit 83. The liquid crystal display unit 83 is formed so as to include the foregoing electro-optical device 100.

Figure 20:
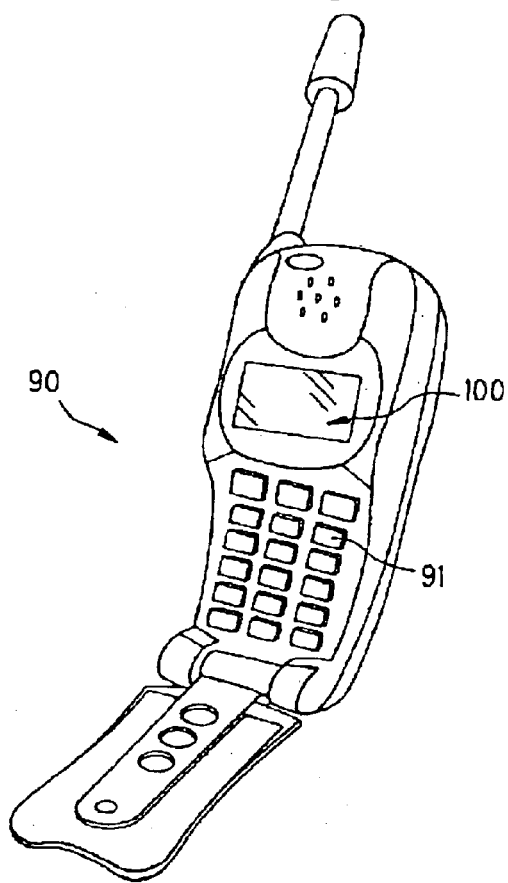
FIG. 20 is a schematic perspective view that illustrates a mobile phone as another example electronic apparatus using the electro-optical device according to the present invention.

FIG. 20 is a schematic of a mobile phone as another example of the electronic apparatus. The portable phone 90 has a plurality of operation buttons 91 and a display including the foregoing electro-optical device 100.

The present invention is not limited to the above-described exemplary embodiments, and instead can be modified as needed within the scope of the accompanied claims and the essence of the invention which can read in the entire specification. Accordingly, a thin-film semiconductor device and an electro-optical device, methods of manufacturing these devices, and a reticle, all accompanying such a modification, are included within the scope of the spirit of the present invention.

What is claimed is:

1. An electro-optical device comprising:
   thin film transistors including a semiconductor film; and
   storage capacitors connected to the thin film transistors,
   an extension region extending from the semiconductor film doubles as one electrode of one of the storage capacitors,
   the semiconductor film having a pattern including at least two outer corners, and
   at least two outer corners including a first outer corner having an interior angle greater than 180° and less than 270° and a second outer corner adjacent to the first outer corner and having an interior angle greater than 90° and less than 180°.

2. An electro-optical device comprising:
   thin film transistors including a semiconductor film; and
   storage capacitors connected to the thin film transistors,
   an extension region extending from the semiconductor film doubles as one electrode of one of the storage capacitors,
   the semiconductor film having a pattern including at least two outer corners, and
   at least two outer corners including third and fourth outer corners adjacent to each other, each outer corner having an interior angle greater than 180° and less than 270°.

3. An electro-optical device comprising:
   thin film transistors including a semiconductor film; and
   storage capacitors connected to the thin film transistors,
   an extension region extending from the semiconductor film doubles as one electrode of one of the storage capacitors,
   the semiconductor film having a pattern including at least two outer corners, and
   at least two outer corners including a fifth outer corner having an interior angle greater than 180° and less than 270° and a sixth outer corner adjacent to the fifth outer corner and having an interior angle equal to or greater than 90°.

4. A thin-film semiconductor device comprising a thin film which includes a pattern including a bent shape or a projected shape and which includes a conductive material,
   at least one set formed of a first line segment that is part of a scanning line and a second line segment projecting from the scanning line, which define an intersection of the bent shape or the projected shape and which are consecutive, including a third line segment between ends of the first line segment and the second line segment and forming a smooth intersection in which each of the angles formed between the third line segment and the first line segment and between the third line segment and the second line segment is greater than 90° and less than 180°.

5. The thin-film semiconductor device according to claim 1, an insulating film having a thickness in the range from 10 to 150 nm (nanometers) being formed on the thin film, and another thin film including a conductive material being formed on the insulating film.

6. The thin-film semiconductor device according to claim 4, each of the angles formed between the third line segment and the first line segment and between the third line segment and the second line segment being about 135°.

7. The thin-film semiconductor device according to claim 4, an insulating film having a thickness equal to or less than 50 nm being formed on the thin film and another thin film including a conductive material being formed on the insulating film, and
   each of the angles formed between the third line segment and the first line segment and between the third line segment and the second line segment being greater than 135°.

8. The thin-film semiconductor device according to claim 4, the one set including a plurality of the third line segments that are consecutive and forming a smooth intersection in which each of the angles formed between the consecutive third line segments being greater than 90° and less than 180°.

9. The thin-film semiconductor device according to claim 4, an arc having a predetermined curvature lying between the ends of the first line segment and the second line segment, in place of the third line segment or in addition thereto.

10. The thin-film semiconductor device according to claim 4, each of the angles being an angle of a corresponding outer corner formed outside the pattern when viewed from the smooth intersection.

11. An electro-optical device comprising:

pixel electrodes;

thin film transistors including a semiconductor film connected to the pixel electrodes;

wiring lines connected to the thin film transistors; and storage capacitors connected to the thin film transistors, an extension region extending from the semiconductor film doubles as one electrode of one of the storage capacitors, the semiconductor film having a pattern including at least two outer corners, and at least one electrode forming one storage capacitor including a thin film which includes a pattern including a bent shape or a projected shape and which includes a conductive material;

at least one set formed of one line segment and another line segment, which define an intersection of the bent shape or the projected shape and which are consecutive, including an additional line segment between the ends of the one line segment and the other line segment and forming a smooth intersection in which each of the angles formed between the additional line segment and the one line segment and between the additional line segment and the other line segment is greater than 90° and less than 180°.

12. The electro-optical device according to claim 11, an insulating film having a thickness of 10 to 150 nm being formed on the thin film, and another thin film including a conductive material being formed on the insulating film.

13. The electro-optical device according to claim 11, each of the angles formed between the third line segment and the first line segment and between the third line segment and the second line segment being about 135°.

14. The electro-optical device according to claim 11, said at least one electrode forming the storage capacitor being formed from the same semiconductor film as the thin film transistors.

15. A reticle comprising:

a pattern, or a negative shape of the pattern, formed therein, the pattern including at least one set of a first line segment that is a part of a scanning line and a second line segment that projects from the scanning line, which define an intersection of the bent shape or the projected shape and which are consecutive, including a third line segment between the ends of the first line segment and the second line segment, and including a smooth intersection in which each of the angles formed between the third line segment and the first line segment and between the third line segment and the second line segment is greater than 90° and less than 180°.

* * * * *